United States Patent
Ando et al.

(10) Patent No.: US 9,350,078 B2
(45) Date of Patent: May 24, 2016

(54) STRUCTURAL BODY, PRINTED SUBSTRATE, ANTENNA, TRANSMISSION LINE WAVEGUIDE CONVERTER, ARRAY ANTENNA, AND ELECTRONIC DEVICE

(75) Inventors: Noriaki Ando, Tokyo (JP); Hiroshi Toyao, Tokyo (JP)

(73) Assignee: NEC CORPORATION, Tokyo (JP)

( * ) Notice: Subject to any disclaimer, the term of this patent is extended or adjusted under 35 U.S.C. 154(b) by 784 days.

(21) Appl. No.: 13/513,827

(22) PCT Filed: Dec. 6, 2010

(86) PCT No.: PCT/JP2010/071853
§ 371 (c)(1),
(2), (4) Date: Jul. 23, 2012

(87) PCT Pub. No.: WO2011/068238
PCT Pub. Date: Jun. 9, 2011

(65) Prior Publication Data
US 2012/0287000 A1    Nov. 15, 2012

(30) Foreign Application Priority Data
Dec. 4, 2009    (JP) ................................. 2009-276533

(51) Int. Cl.
*H01Q 1/38* (2006.01)
*H01Q 9/04* (2006.01)
*H01Q 21/08* (2006.01)

(52) U.S. Cl.
CPC ............. *H01Q 9/0407* (2013.01); *H01Q 21/08* (2013.01)

(58) Field of Classification Search
CPC ............................ H01Q 21/08; H01Q 9/0407
See application file for complete search history.

(56) References Cited

U.S. PATENT DOCUMENTS

| | | | |
|---|---|---|---|
| 6,262,495 B1 | 7/2001 | Yablonovitch et al. | |
| 6,396,366 B1* | 5/2002 | Raty et al. | ...................... 333/222 |
| 2003/0011522 A1* | 1/2003 | McKinzie et al. | ..... 343/700 MS |
| 2003/0197658 A1* | 10/2003 | Lilly et al. | ..................... 343/909 |
| 2005/0029632 A1* | 2/2005 | McKinzie et al. | ............ 257/665 |
| 2005/0134522 A1 | 6/2005 | Waltho | |
| 2007/0176827 A1* | 8/2007 | Itoh et al. | ............... 343/700 MS |

(Continued)

FOREIGN PATENT DOCUMENTS

| | | |
|---|---|---|
| CN | 1311906 A | 9/2001 |
| CN | 101505004 A | 8/2009 |

(Continued)

OTHER PUBLICATIONS

Chinese Office Action dated Nov. 29, 2013, with English translation.

(Continued)

*Primary Examiner* — Trinh Dinh
(74) *Attorney, Agent, or Firm* — McGinn IP Law Group PLLC

(57) ABSTRACT

A structure of the present disclosure is provided with a first conductor element (11), a conductor pattern (19) facing the first conductor element (11). In the conductor pattern (19), a part opposed to the first conductor element (11) includes a line part (14) with an open end (141), an opening (13) partially surrounding the line part (14) and a second conductor element (12) surrounding the opening (13) and being continuous to the line part (14). The first conductor element (11) and the line part (14) make up a microstrip line (16).

20 Claims, 31 Drawing Sheets

(56) References Cited

U.S. PATENT DOCUMENTS

| | | |
|---|---|---|
| 2008/0048917 A1 | 2/2008 | Achour et al. |
| 2008/0258981 A1 | 10/2008 | Achour et al. |
| 2009/0236141 A1 | 9/2009 | Kim et al. |
| 2010/0238081 A1 | 9/2010 | Achour et al. |
| 2010/0283692 A1 | 11/2010 | Achour et al. |
| 2010/0283705 A1 | 11/2010 | Achour et al. |
| 2011/0039501 A1 | 2/2011 | Achour et al. |
| 2011/0134010 A1* | 6/2011 | Toyao et al. ............ 343/844 |
| 2011/0170267 A1* | 7/2011 | Ando ........................ 361/748 |
| 2012/0242556 A1* | 9/2012 | Ando ........................ 343/834 |

FOREIGN PATENT DOCUMENTS

| | | |
|---|---|---|
| JP | 2002-510886 A | 4/2002 |
| JP | 2005-109933 A | 4/2005 |
| JP | 2006-245926 A | 9/2006 |
| JP | 2006-245984 A | 9/2006 |
| JP | 2009-231793 A | 10/2009 |
| JP | 2009-535942 A | 10/2009 |
| WO | WO 2010/013496 A1 | 2/2010 |
| WO | WO 2010/029770 A1 | 3/2010 |

OTHER PUBLICATIONS

International Search Report in PCT/JP2010/071853 dated Mar. 8, 2011 (English Translation Thereof).

Japanese Office Action dated Nov. 11, 2014 with a partial English translation thereof.

* cited by examiner (section A-A)

(section B-B)

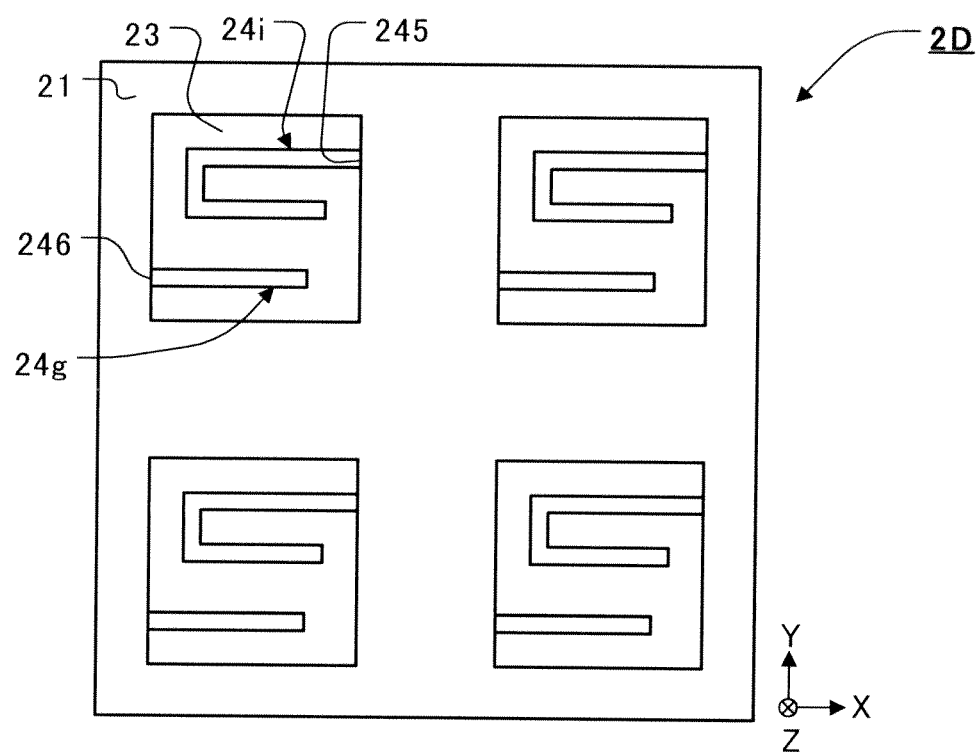

(sectionC-C)

(section D-D)

(section E-E)

(section F-F)

(sectionG-G)

STRUCTURAL BODY, PRINTED SUBSTRATE, ANTENNA, TRANSMISSION LINE WAVEGUIDE CONVERTER, ARRAY ANTENNA, AND ELECTRONIC DEVICE

TECHNICAL FIELD

The present invention relates to a structure, a printed circuit board, an antenna, a transmission line waveguide converter, an array antenna, and an electronic device. More particularly, the invention relates to a structure which is constructed by containing a composite right and left handed medium and in which a dispersion relation on electromagnetic wave is controlled, and a printed circuit board, an antenna, a transmission line waveguide converter, an array antenna, and an electronic device each including the structure.

BACKGROUND ART

In recent years, in an electronic device such as a wireless device, reduction in size and thickness of an antenna is in demand. This is due to the facts such as difficulty to assure space because of high-density packaging and increase in the number of antennas caused by introduction of MIMO (Multiple Input Multiple Output). In particular, for use in mobile devices requested to be small, light, and thin, importance is placed on small size and thinness of an antenna.

As a technique of artificially controlling the dispersion relation of electromagnetic wave propagating in the structure, the metamaterial technique is proposed. As a mode of metamaterial, a composite right and left handed (CRLH) line by which the size of an antenna can be reduced is known. The dispersion relation of the CRLH line is classified to a frequency band (right-handed band) showing the transmission characteristic of electromagnetic wave of a right-handed medium and a frequency band (left-handed band) showing the transmission characteristic of a left-handed medium.

Patent Literature 1 discloses an antenna having a configuration in which unit cells each including a conductor plane, a conductor patch, and a conductor via are arranged periodically. The antenna disclosed in Patent Literature 1 has a structure in which unit cells are disposed periodically and operates as a CRLH line. The antenna disclosed in Patent Literature 1 is constructed by using line length resonance in a left-handed frequency region of the CRLH line.

A normal medium is a right-handed medium. In the right-handed medium, the lower the frequency of electromagnetic wave propagating in the medium is, the longer the wavelength is. Therefore, the lower the operation frequency is, the larger an antenna made of the normal medium is. On the other hand, in the left-handed medium, the lower the frequency of the electromagnetic wave propagating in the medium is, the shorter the wavelength is. As disclosed in Patent Literature 1, when an antenna is made of the left-handed medium, the size of a resonator can be reduced, and smaller size of an antenna can be realized.

The antenna disclosed in Patent Literature 1 has a conductor element disposed between the conductor plane and the conductor patch. With the configuration, in the antenna disclosed in Patent Literature 1, the capacitance between conductor patches neighboring each other can be increased, and the frequency of the operation frequency band can be lowered. The antenna disclosed in Patent Literature 1 has a slit around the connection part between the conductor plane and the conductor via to form a coplanar line. Consequently, in the antenna disclosed in Patent Literature 1, the inductance between the conductor planar and the conductor patch can be increased, and the frequency of the operation frequency band can be lowered.

It is also possible to design a structure having a band gap between the left-handed band and the right-handed band. Such a structure having a band gap is called an electromagnetic band gap (EBG) structure. The EBG structure functions as a magnetic wall reflecting incident electromagnetic wave in phase around the band gap. When the EBG structure is mounted on the back face of an antenna, without deteriorating radiation efficiency, lower height of the antenna can be realized. By using the EBG structure, a measure against noise caused by the electromagnetic wave can be taken.

BACKGROUND ART LITERATURE

Patent Literature

Patent Literature 1: U.S. Patent Application Publication No. 2007-0176827

DISCLOSURE OF INVENTION

Problems to be Solved by the Invention

The CRLH line disclosed in Patent Literature 1 has to have a conductor via for connecting a conductor plane and a conductor patch and, therefore, has a problem such that the configuration cannot be simplified.

As described above, the CRLH line is a structure, as the left-handed medium or the EBG structure, effective for reduction in the size of an electronic device, a measure against noise, and the like. Such a structure is requested to have a simple and high-reliable configuration in order to reduce the size of an electronic device.

The present invention has been made in consideration of the above-described circumferences, and an object of the invention is to provide a structure having a simple configuration functioning as a CRLH line, a low-cost high-reliable printed circuit board, an antenna, a transmission line waveguide converter, an array antenna, and an electronic device.

Means for Solving the Problems

To achieve the object, a structure according to a first aspect of the present invention includes at least one first conductor element, a conductor pattern having at least one second conductor element facing the first conductor element, and a first medium generating capacitance between the first and second conductor elements. The first conductor element and the conductor pattern face each other via the first medium. The second conductor element has a line part having an open end and has an opening partially surrounding the line part. The line part is continuous to the second conductor element. The opening is surrounded by the second conductor element. The first conductor element and the line part make up a microstrip line.

To achieve the object, an antenna according to a second aspect of the present invention includes a structure and a power feeder. The structure includes at least one first conductor element, a conductor pattern having at least one second conductor element facing the first conductor element, and a first medium generating capacitance between the first and second conductor elements. The first conductor element and the conductor pattern face each other via the first medium. The second conductor element has a line part having an open end and has an opening partially surrounding the line part.

The line part is continuous to the second conductor element. The opening is surrounded by the second conductor element. The power feeder is electrically connected to the first conductor element or the conductor pattern of the structure.

To achieve the object, a printed circuit board according to a third aspect of the present invention has a structure. The structure includes at least one first conductor element, a conductor pattern having at least one second conductor element facing the first conductor element, and a first medium generating capacitance between the first and second conductor elements. The first conductor element and the conductor pattern face each other via the first medium. The second conductor element has a line part having an open end and has an opening partially surrounding the line part. The line part is continuous to the second conductor element. The opening is surrounded by the second conductor element. The first conductor element and the line part make up a microstrip line.

To achieve the object, a transmission line waveguide converter according to a fourth aspect of the present invention has a structure. The structure includes at least one first conductor element, a conductor pattern having at least one second conductor element facing the first conductor element, and a first medium generating capacitance between the first and second conductor elements. The first conductor element and the conductor pattern face each other via the first medium. The second conductor element includes a line part having an open end and has an opening partially surrounding the line part. The line part is continuous to the second conductor element. The opening is surrounded by the second conductor element. The first conductor element and the line part make up a microstrip line.

To achieve the object, an array antenna according to a fifth aspect of the present invention is constructed by disposing a plurality of array elements in the same plane, and each of the array elements is an antenna having a structure and a power feeder. The structure includes at least one first conductor element, a conductor pattern having at least one second conductor element facing the first conductor element, and a first medium generating capacitance between the first and second conductor elements. The first conductor element and the conductor pattern face each other via the first medium. The second conductor element includes a line part having an open end and has an opening partially surrounding the line part. The line part is continuous to the second conductor element. The opening is surrounded by the second conductor element. The power feeder is electrically connected to the first conductor element or the conductor pattern of the structure.

To achieve the object, an electronic device according to a sixth aspect of the present invention includes: an antenna having a structure and a power feeder; and at least one of a transmitter and a receiver connected to the antenna. The structure includes at least one first conductor element, a conductor pattern having at least one second conductor element facing the first conductor element, and a first medium generating capacitance between the first and second conductor elements. The first conductor element and the conductor pattern face each other via the first medium. The second conductor element includes a line part having an open end, and has an opening partially surrounding the line part. The line part is continuous to the second conductor element. The opening is surrounded by the second conductor element. The power feeder is electrically connected to the first conductor element or the conductor pattern of the structure.

To achieve the object, an electronic device according to a seventh aspect of the present invention includes at least one of the structure according to the first aspect of the present invention, the antenna according to the second aspect of the invention, the printed circuit board according to the third aspect of the invention, the transmission line waveguide converter according to the fourth aspect of the invention, and the array antenna according to the fifth aspect of the invention.

Effect of the Invention

According to the present invention, the structure having a simple configuration functioning as a CRLH line, the low-cost high-reliability printed circuit board, the antenna, the transmission line waveguide converter, the array antenna, and the electronic device can be provided.

BRIEF DESCRIPTION OF DRAWINGS

FIG. 21 is a plan view of another structure of the second embodiment;

MODE FOR CARRYING OUT THE INVENTION

A structure functioning as an antenna according to embodiments of the present invention will now be described. To make characteristics parts understood easily, the dimensions and scale sizes of structures in the diagrams may be different from those of actual structures. The positional relations and the like of the components will be described on the basis of an xyz coordinate system. In the xyz coordinate system, two directions orthogonal to each other in the plane direction of a first conductor element are expressed as an x-axis direction and a y-axis direction, and the direction normal to the first conductor element is expressed as a z-axis direction.

First Embodiment

Figure 1A:
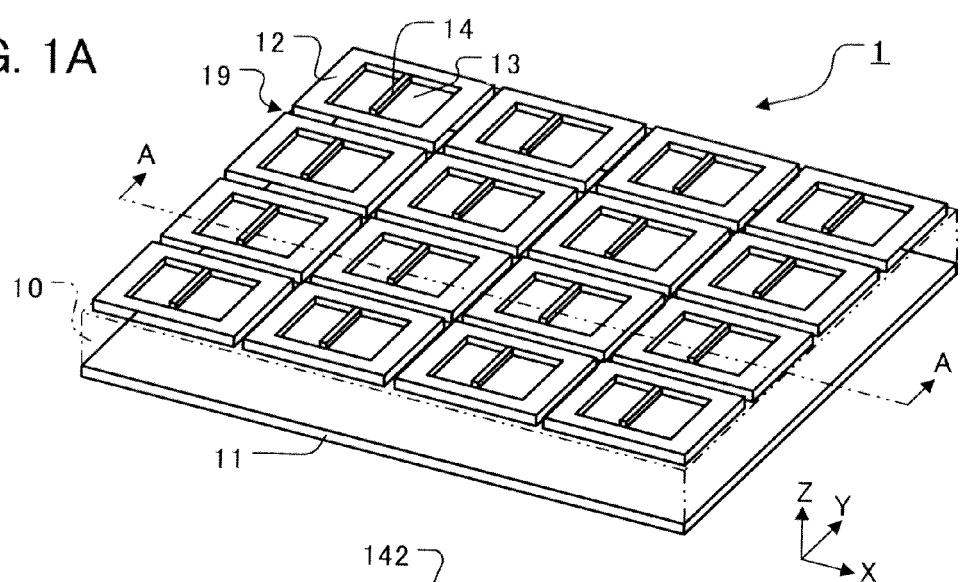
FIGS. 1A, 1B, and 1C are perspective view, plan view, and cross section, respectively, of a structure of a first embodiment.

First, a structure 1 according to a first embodiment will be described. As shown in FIG. 1A, the structure 1 has a conductor plane 11 as a first conductor element and a conductor pattern 19 facing the conductor plane 11. The conductor pattern 19 is disposed apart from the conductor plane 11 and overlapped in an apart place.

The conductor pattern 19 includes a conductor patch 12 as a second conductor element and a wire 14 as a line part. Each of the conductor plane 11 and the conductor patch 12 is formed by, for example, a conductor thin plate or a conductor thin film. The conductor plane 11 is provided, for example, on one of faces of a dielectric substrate 10, and the conductor patch 12 is provided, for example, on the other face of the dielectric substrate 10. The dielectric substrate 10 is, for example, an epoxy resin substrate or a ceramic substrate.

Figure 1B:
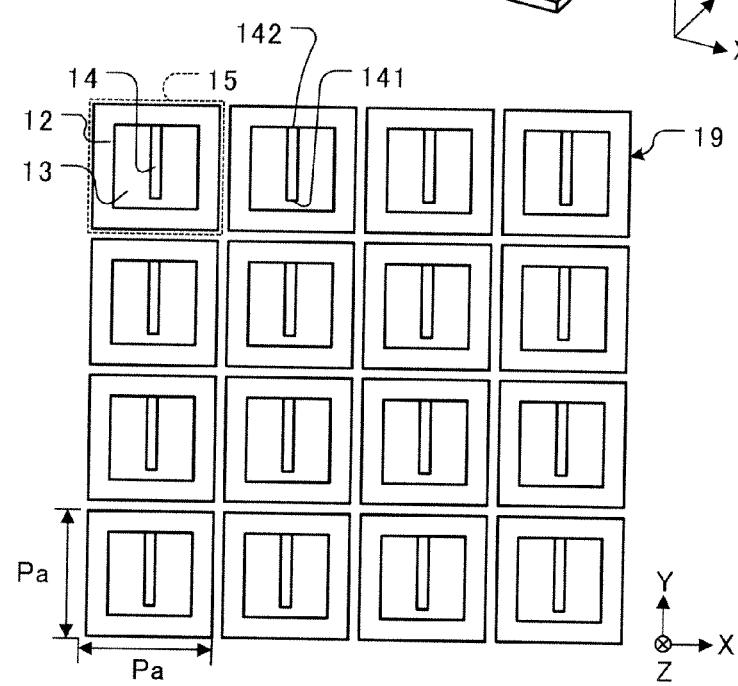

As shown in FIG. 1B, the conductor pattern 19 includes a plurality of conductor patches 12. Each conductor patch 12 has an opening 13 and the wire 14. The conductor patches 12 are arranged in the x and y directions at almost equal pitches and also arranged in the y direction at almost equal pitches. The conductor patches 12 are disposed so as to face the conductor plane 11. The plurality of conductor patches 12 are disposed so as to be apart from one another. The outer shape of the conductor patch 12 in plan view is, although not limited, for example, an almost square frame shape.

Figure 1C:
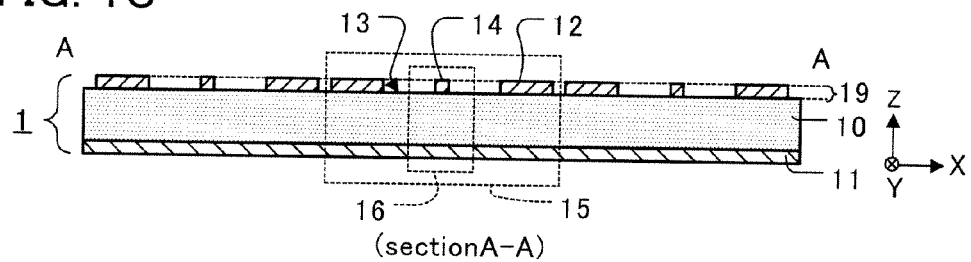

The wire 14 has at least one open end 141, continuous to the conductor patch 12 at a connection part 142, and is disposed so as to extend toward the inside of the frame shape of the conductor patch 12. The shape of the wire 14 in plan view is, although not limited, for example, an almost linear band shape. The width of the wire 14 is almost uniform. Although the wire 14 is formed integrally with the conductor patch 12 in the embodiment, the invention is not limited to the configuration. The wire 14 may be formed independently of the conductor patch 12. As shown in FIG. 1C, the wire 14 and a part of the conductor plane 11 facing the wire 14 make up a microstrip line 16.

The gap between the conductor patch 12 and the wire 14 is the opening 13. The opening 13 surrounds the wire 14 of the part except for the connection part 142. That is, the conductor patch 12 has a structure in which the opening 13 is provided and the wire 14 is provided in the opening 13. The conductor patch 12, the opening 13, and the wire 14 are formed on the same plane. The plane shape of the opening 13 is, although not limited, for example, an almost square like the shape of the periphery on the side of the conductor patch 12 (hereinbelow, called the outer periphery of the opening).

The wire 14 is made of the same material as that of the conductor patch 12. For example, using a conductor thin plate as a base member, the opening 13 having an almost U shape is formed in the base member. In such a manner, the wire 14 is integral with the conductor patch 12. By forming the wire 14 integrally with the conductor patch 12, the man-hour becomes smaller than that in the case of forming the conductor patch 12 and the wire 14 independently of each other. By forming the wire 14 and the conductor patch 12 integrally with each other, the contact resistance between the wire 14 and the conductor patch 12 can be also eliminated.

The structure 1 has a plurality of unit cells 15. The unit cell 15 is a part having a region defined at the same pitch as that of the conductor patch 12. For example, when the pitch in the x direction of the conductor patch 12 is Pa and the pitch in the y direction of the conductor patch 12 is Pa, the unit cell 15 has a square region whose dimension in the x direction is Pa and whose dimension in the y direction is Pa.

That is, the unit cell 15 has one conductor patch 12, the conductor plane 11 of the part facing the conductor patch 12, and the wire 14 which is conductive to the conductor patch 12. The structure 1 has a configuration in which the unit cells 15 are two-dimensionally arranged. The dimensions and shapes of the conductor patch 12, the opening 13, and the wire 14 of the unit cell 15 are almost the same in the plurality of unit cells 15. By making the shapes and dimensions of the components of the plurality of unit cells 15 the same, the design of the structure 1 is facilitated.

Figure 2:
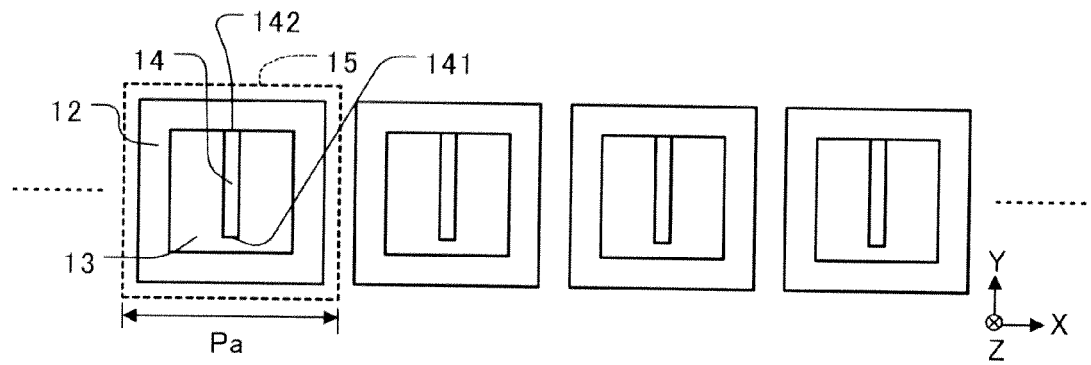
FIG. 2 is a plan view of unit cells arranged one-dimensionally.
Figure 3:
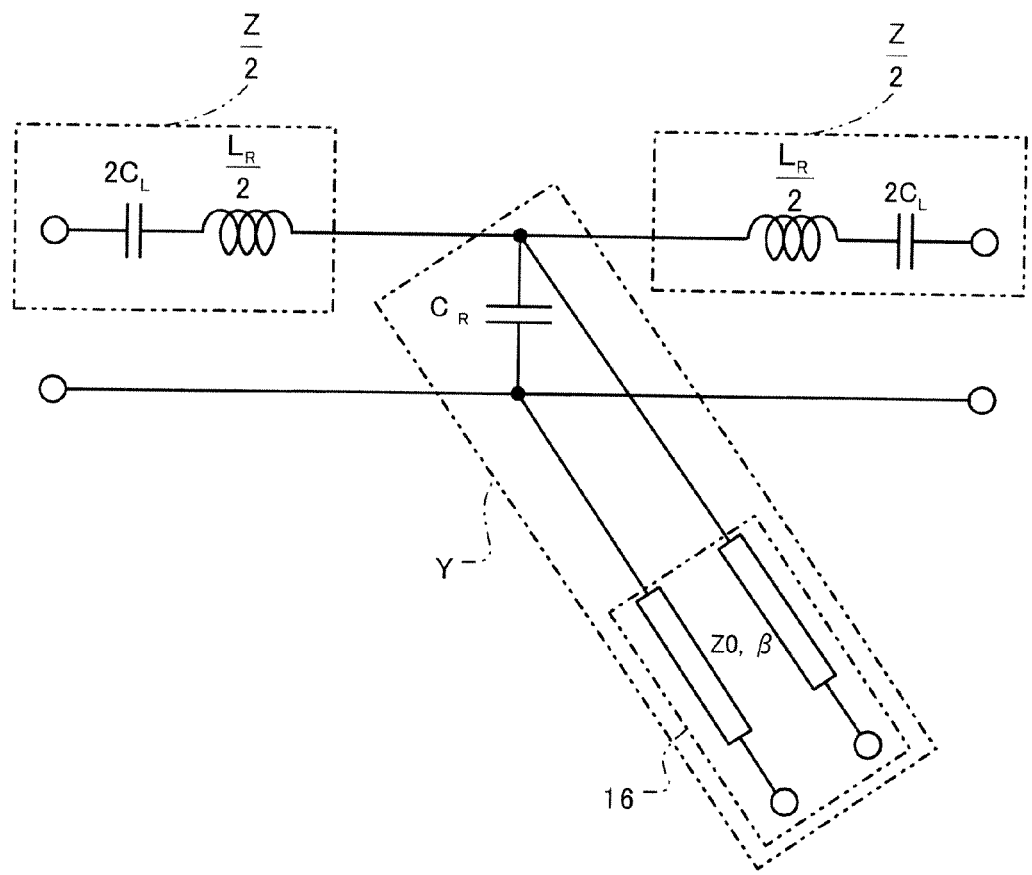
FIG. 3 is an equivalent circuit diagram of unit cells arranged one-dimensionally.

When the unit cells 15 are arranged one-dimensionally, the configuration as shown in FIG. 2 is obtained. An equivalent circuit of one unit cell 15 is a circuit as shown in FIG. 3. When attention is paid to a circuit configuration in one direction in which the unit cells 15 are arranged, the equivalent circuit diagram of each unit cell 15 in the case where the unit cells 15 are disposed two-dimensionally is similar to that of each unit cell 15 in the case where the unit cells 15 are disposed one-dimensionally.

In the equivalent circuit shown in FIG. 3, a capacitor $C_R$ means a capacitor per unit cell 15 generated between the conductor patch 12 and the conductor plane 11, and inductance $L_R$ means inductance per unit cell 15 generated between the conductor patch 12 and the conductor plane 11. A capacitor $C_L$ means a capacitor between neighboring two conductor patches 12. The microstrip line 16 is shunt in parallel to the capacitor CR, that is, only a part (connection part 142) of the wire 14 is continuous to the conductor patch 12. Since the wire 14 includes the open end 141, the terminating end of the microstrip line 16 is open. As described above, when the width of the wire 14 is almost uniform, distributions of the inductance and the capacitor in each part of the wire 14 are uniform in the wire 14, and the characteristics of an EBG structure and the characteristics of a left-handed material become excellent.

Figure 4:
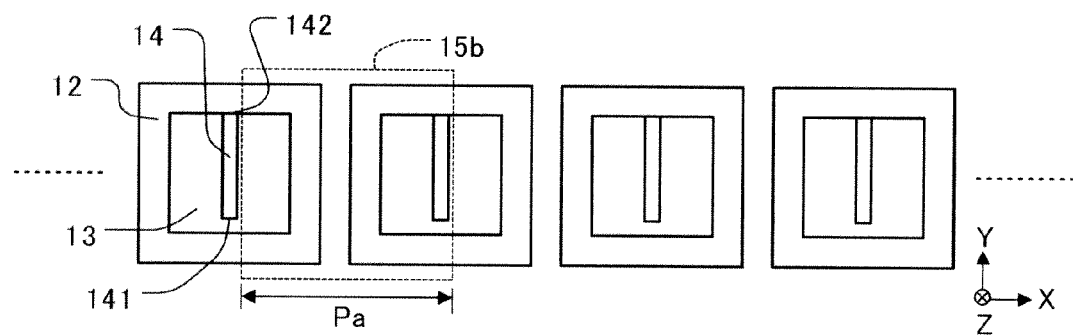
FIG. 4 is a plan view of unit cells in a position different from FIG. 2.
Figure 5:
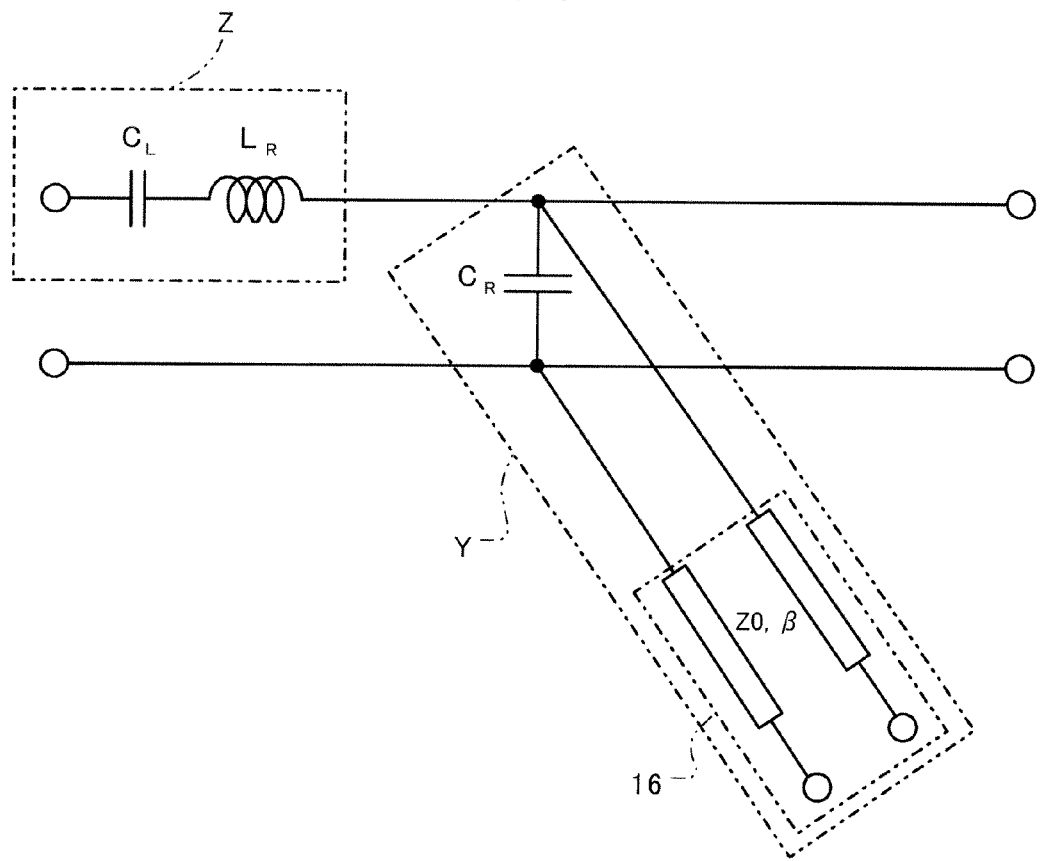
FIG. 5 is an equivalent circuit diagram of unit cells in a position different from FIG. 2.

An equivalent circuit of a unit cell 15b as a region as shown in FIG. 4 is a circuit as shown in FIG. 5. The unit cell 15 shown in FIG. 2 is a region in which the wire 14 is in the center and, in contrast, the unit cell 15b shown in FIG. 4 is a region in which the wire 14 is positioned at the end. The position of the unit cell 15b is deviated to the X direction from the position of the unit 15.

In comparison between the equivalent circuit shown in FIG. 3 and the equivalent circuit shown in FIG. 5, depending on the difference in the ways of taking the unit cells, the equivalent circuits in the unit cells are different from each other. However, in the case where the unit cells are arranged periodically, the characteristic of the electromagnetic wave propagating in the plane direction of the structure 1 does not depend on the ways of taking the unit cells. That is, the characteristic of the electromagnetic wave propagating through the structure 1 is determined by frequency characteristics of impedance Z and admittance Y in the equivalent circuit diagram shown in FIG. 5.

Figure 6:
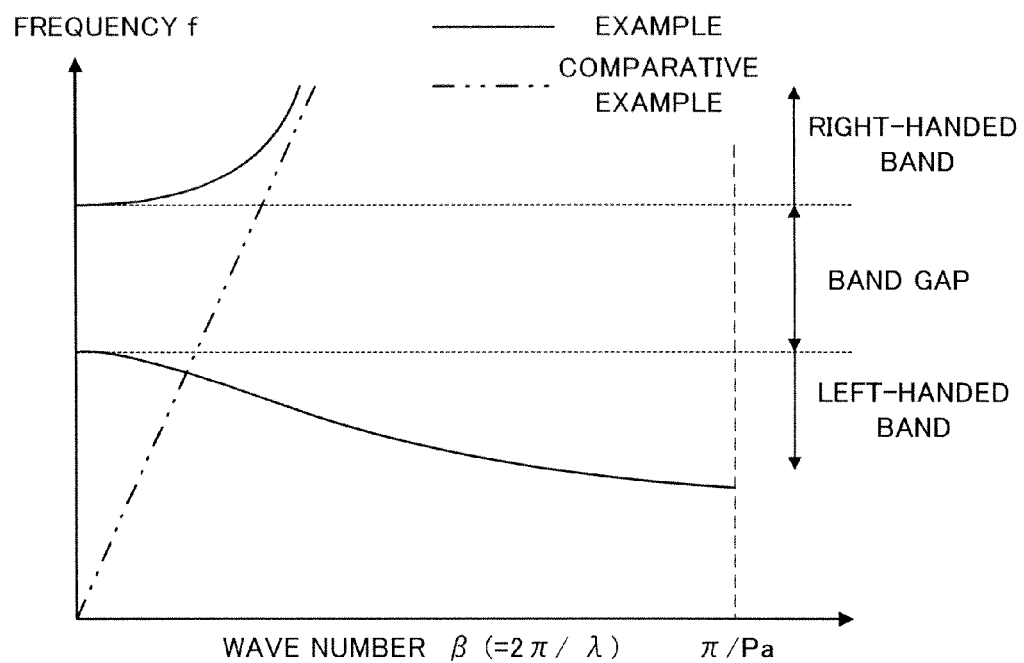
FIG. 6 is a graph showing the dispersion relation of the structure according to the present invention.

The electromagnetic wave propagation characteristic of the structure 1 is expressed by the graph as shown in FIG. 6. In FIG. 6, the vertical axis expresses the frequency "f", and the horizontal axis expresses wave number $\beta(=2\pi/\lambda)$. The solid line expresses a dispersion relation (dispersion curve) of the embodiment when it is regarded that the unit cells 15 are periodically-arrayed in the structure 1. The alternate long and two short dashes line indicates a dispersion relation of a comparative example in which the conductor plane 11 is disposed in place of the conductor patch 12 and the wire 14, that is, a dispersion relation of parallel plate waveguide in which two conductor plates are disposed parallel to each other.

In the dispersion relation of the parallel plate waveguide of the comparative example, the proportional relation is satisfied between the wave number $\beta$ and the frequency "f". In the comparative example, the slope f/β of the frequency "f" relative to the wave number $\beta$ is expressed by the following expression (1) by using light speed "c".

$$f/\beta c/(2\pi \cdot (\in \mu r)^{1/2}) \qquad (1)$$

A medium showing such a dispersion relation that the frequency "f" increases as the wave number $\beta$ increases is called a right-handed medium. On the other hand, a medium showing a dispersion relation that the frequency "f" decreases as the wave number $\beta$ increases is called a left-handed medium.

The dispersion characteristic of the structure 1 indicated by the solid line includes a right-handed band in which the frequency "f" increases as the wave number $\beta$ increases and a left-handed band in which the frequency "f" decreases as the wave number $\beta$ increases. The gap between the right-handed band and the left-handed band is a band gap in which propagation of the electromagnetic wave is prohibited.

In the dispersion relation of the medium, the larger the wave number corresponding to predetermined frequency "f" is, the shorter the wavelength λ (λ=2π/β) of the electromagnetic wave which propagates in the medium is. As the wavelength λ of the electromagnetic wave becomes shorter, a resonator can be made smaller. For example, a resonator antenna can be made smaller. That is, when a condition that the wave number λ for the frequency "f" is larger than that in the comparative example is satisfied, the size of the resonator can be reduced. The structure of the embodiment is a magnetic wall which reflects an electromagnetic wave in phase in a frequency band corresponding to the band gap and can be made function as, for example, a reflector which reflects a predetermined electromagnetic wave.

The left-handed band is a frequency band in which the impedance Z shown in FIG. 5 becomes capacitive (the imaginary part of the impedance Z is negative) and the admittance Y is inductive (the imaginary part of the admittance Y is negative). The admittance Y is determined by input admittance of the microstrip line 16 and the capacitor CR. The input admittance of the microstrip line 16 is determined by the length and effective dielectric constant of the microstrip line 16. The input admittance of the microstrip line 16 at a certain frequency becomes capacitive or inductive depending on the line length and the effective dielectric constant. The effective dielectric constant of the microstrip line 16 is determined by a material filling the gap between the conductor plane 11 and the wire 14, for example, the material of the dielectric substrate 10.

In the structure 1 having a configuration as described above, the length of the microstrip line 16 is determined by the shape and dimension of the wire 14, so that the range of a numerical value which can be selected as the length of the microstrip line 16 becomes particularly wide. Since the design flexibility of the length of the microstrip line 16 is high, the design flexibility of the admittance Y is accordingly high, and the dispersion relation of the structure can be easily controlled. Thus, for example, it becomes easier to set the band gap in a desired frequency hand, and the structure 1 can be made operate as the EBG structure or the left-handed medium in a desired band.

As described above, in the structure 1 according to the present invention, the CRLH line can be realized by a conductive two-layer structure made of a conductive layer including the conductor plane 11 and a conductor layer including the conductor pattern 19. Therefore, it is unnecessary to provide a conductive via for making the conductor plane 11 and the conductor pattern 19 conductive, and the CRLH line having a simple configuration can be realized. Further, by not providing a conductive via, the manufacture cost of the structure 1 can be decreased. By not providing a conductive via, deterioration in reliability due to poor connection of a conductive via and a characteristic change in the structure 1 caused by a change in the connection resistance of the conductor via due to deterioration with time or the like can be also avoided.

In the structure 1, the longer the length of the microstrip line 16 is, the lower the frequency of the band gap is. Since it is easy to increase the length of the line, the frequency of the band gap can be easily lowered. Therefore, from the viewpoint of realizing low frequency of the band gap, the necessity of making the effective dielectric constant of the microstrip line 16 is low. Consequently, flexibility in selection of the material filling the gap between the conductor plane 11 and the wire 14 is very high, and the cost of the structure 1 can be decreased.

In the structure 1, the band of the band gap is easily controlled. Consequently, a band behaving as a magnetic wall which reflects electromagnetic wave in phase and a band behaving as a left-handed medium can be easily controlled. Therefore, the structure 1 can be used as a reflector or a resonator of an antenna in a desired frequency band.

In the embodiment, since the transmission line (microstrip line) is constructed by the first conductor element and the line part and one of ends of the transmission line is an open end, the structure functions as a CRLH line in a frequency band in which input impedance seen from the other end shows inductive behavior.

The band in which the input impedance of the transmission line having the open end is inductive depends on the length of the line part and the material between the first conductor element and the conductor pattern. By adjusting the length of the line part in accordance with the length of the line part and the dielectric constant of the material between the first conductor element and the conductor pattern, the characteristic of the CRLH line can be designed. Therefore, the flexibility in selection of the material between the first conductor element and the conductor pattern becomes high, and the structure behaving as a left-handed medium or an EBG structure having a desired characteristic can be realized at low cost.

Since a conductor via for making the first conductor element and the conductor pattern conductive is unnecessary, the configuration can be simplified only by the amount of the conductor via which is not provided.

Modifications

The technical scope of the present invention is not limited to the first embodiment. The structure of the present invention can be variously modified without departing from the gist of the invention. Modifications of the structure of the present invention will now be described.

Figure 7:
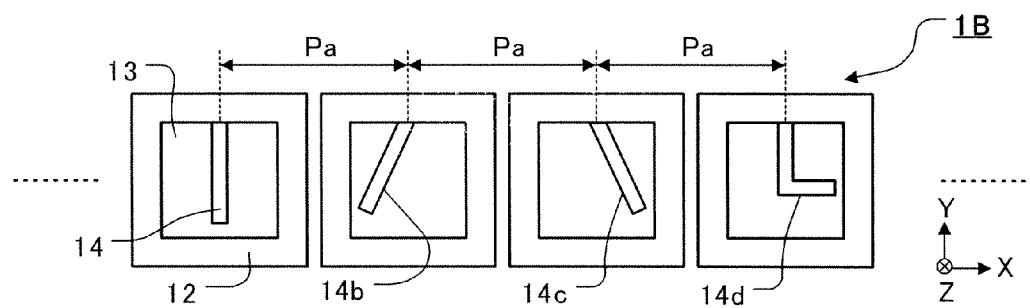
FIG. 7 is a plan view of another structure of the first embodiment.

In the first embodiment, the configuration that the shapes and dimensions of the various elements are the same in the plurality of unit cells 15 has been described. The shapes of a plurality of wires may be different from one another like in a structure 1B shown in FIG. 7. The structure 1B includes a plurality of conductor patches 12 and has wires in the conductor patches 12. The shapes and extension directions of a plurality of wires 14, 14b, 14c, and 14d are different from one another. The lengths of the plurality of wires 14, 14b, 14c, and 14d are almost the same, and connection parts between the wires and the corresponding conductor patches 12 are disposed periodically at a pitch Pa.

When the lengths of the plurality of wires are almost the same and the positions of the connection parts are almost periodical, an equivalent circuit corresponding to the configuration is the same as that shown in FIGS. 3 and 5. That is, when the lengths of the wires are almost equal to each other, the shape hardly exerts an influence on the electromagnetic wave propagation characteristic. The plane shape of the wire may be, except for an almost linear shape, a polygonal line shape or a curved shape, or a combination of those shapes. From the viewpoint of excellence in the characteristic of the EBG structure or the left-handed medium, preferably, the widths of the wires are almost uniform in the extension direction of the wires.

Figure 8:
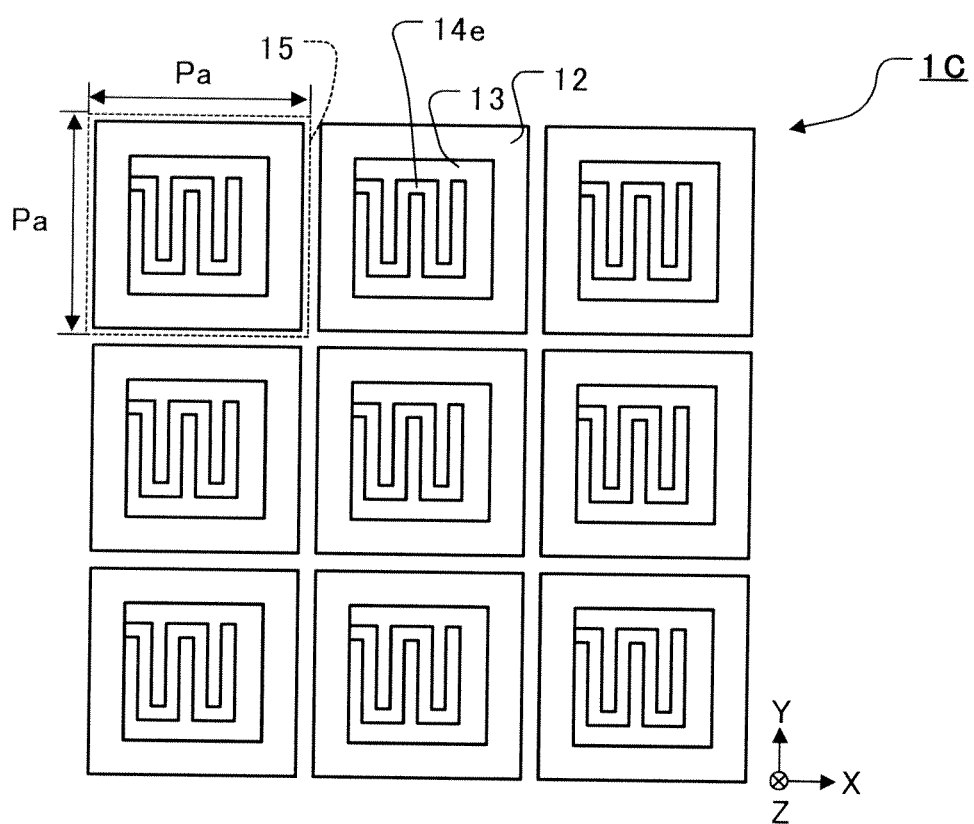
FIG. 8 is a plan view of another structure of the first embodiment.

In the case of setting the wire length to be long without increasing the dimensions of the unit cell, a meander-shaped wire 14e in a structure 1C shown in FIG. 8 may be employed.

Figure 9:
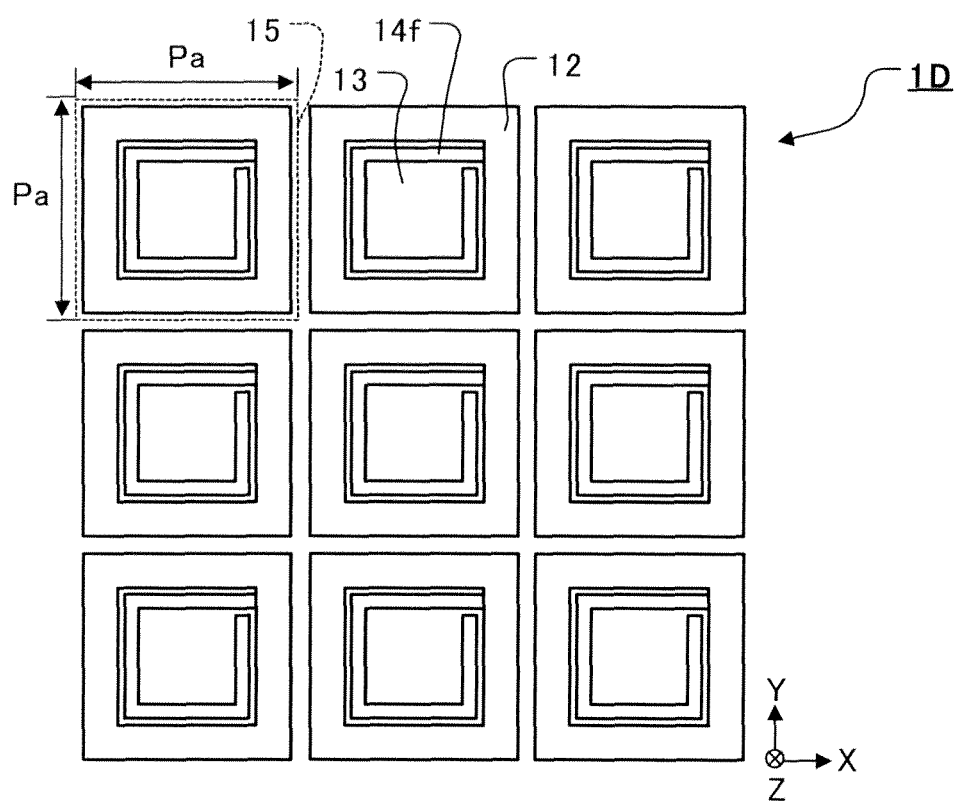
FIG. 9 is a plan view of another structure of the first embodiment.

In place of the meander-shaped wire 14e, a loop-shaped wire 14f in a structure 1D shown in FIG. 9 may be employed.

Figure 10:
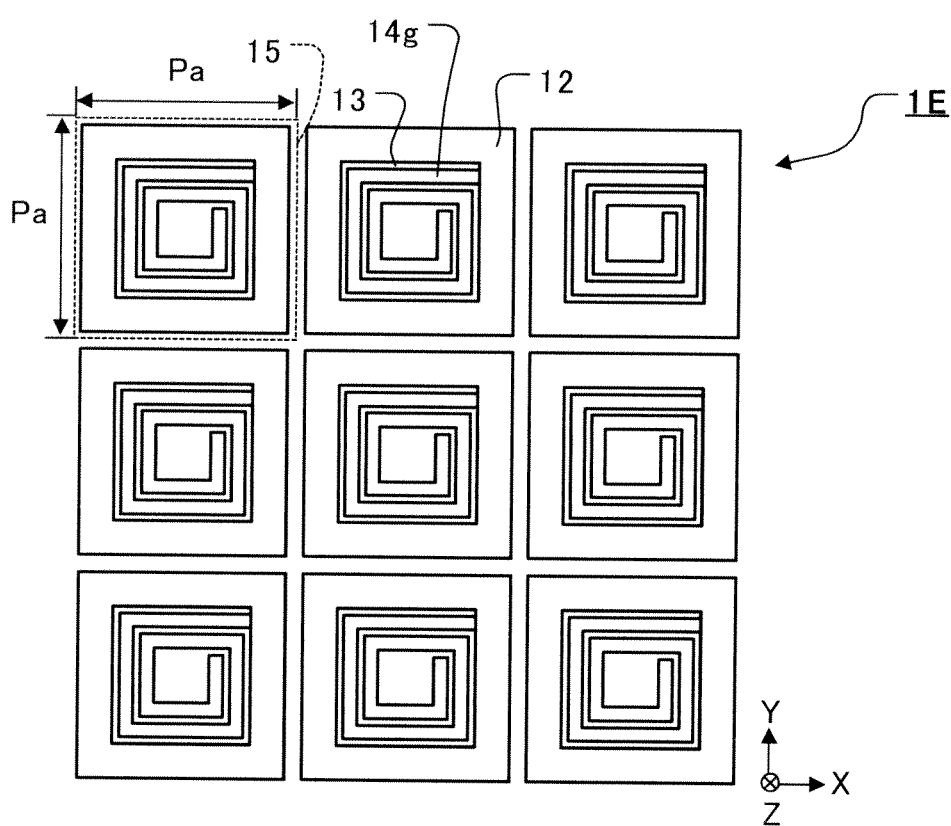
FIG. 10 is a plan view of another structure of the first embodiment.

Further, a spiral-shaped wire 14g in a structure 1E shown in FIG. 10 may be employed.

In any of the shapes of the wires, by adjusting the wire length, the input admittance of the microstrip line 16 in the equivalent circuit can be adjusted. When the wire length is increased, the frequency at which the input admittance of the microstrip line 16 changes from inductive property to capacitive property can be lowered, and the upper limit frequency of the left-handed band can be lowered. That is, by setting the length of the wire, the left-handed band can be designed and, for example, the frequency of the left-handed band can be lowered.

Figure 11:
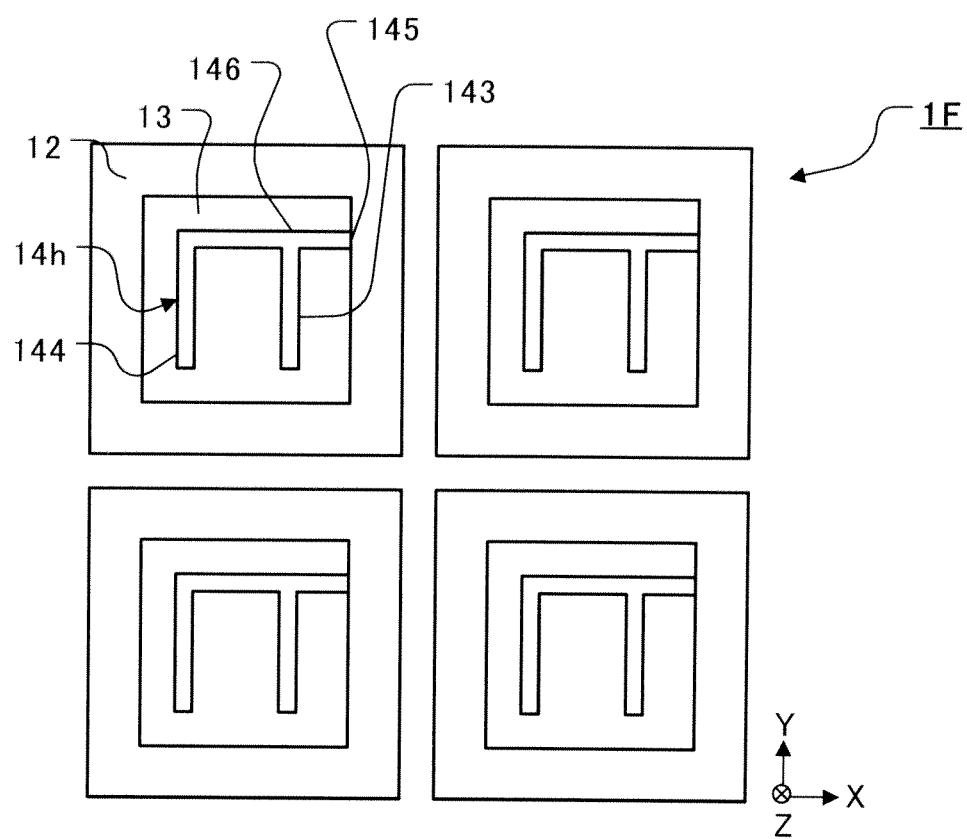
FIG. 11 is a plan view of another structure of the first embodiment.

In the first embodiment, the wire 14 which is not branched is used as the line part. Like a structure 1F shown in FIG. 11, a wire 14h including a plurality of branch lines may be also employed as the line part. The wire 14h is continuous to the conductor patch 12 via a connection part 145 but is apart from the inner periphery of the conductor patch 12 in the part other than the connection part 145. The wire 14h includes a branch part 146 and further includes branch wires 143 and 144 using the branch part 146 as a start point. The end opposite to the branch part 146, of each of the branch wires 143 and 144 is an open end. The length from the branch part 146 along the branch wire 143 to the open end of the branch wire 143, that is, the length of the branch wire 143 is different from that of the branch wire 144. By constructing the line part including the branch wires whose lengths are different from each other, the frequency at which the admittance Y of the microstrip line 16 changes from the capacitive property to inductive property can be adjusted, and band designing of high flexibility can be realized.

Figure 12:
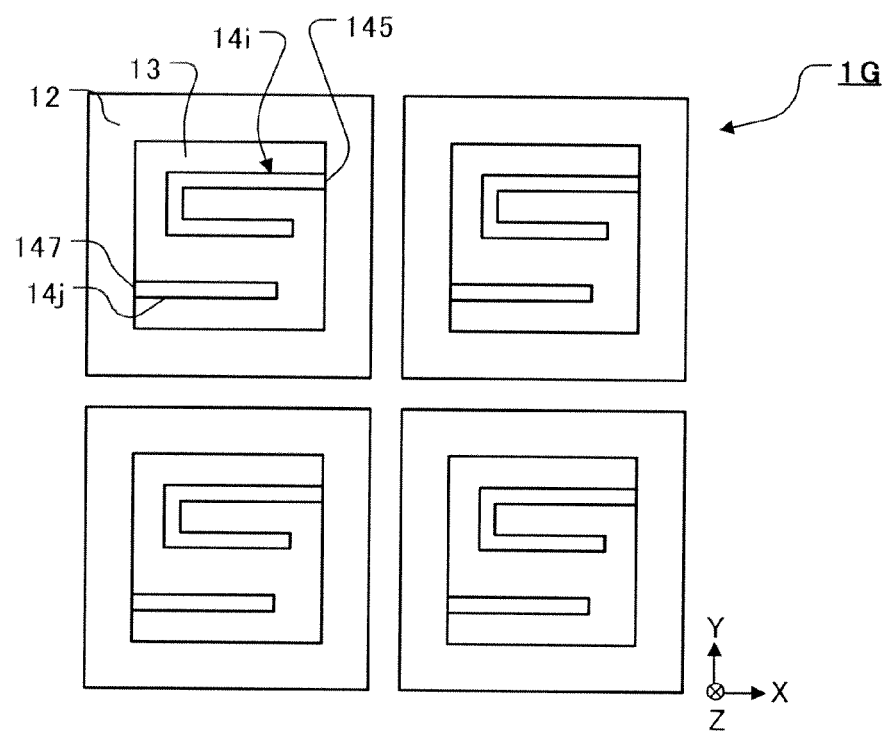
FIG. 12 is a plan view of another structure of the first embodiment.

In place of using the branch wire, like a structure 1G shown in FIG. 12, a line part made by a plurality of wires 14i and 14j which are independent of each other may be provided. The wire 14i is continuous to the conductor patch 12 via the connection part 145. The wire 14j is continuous to the conductor patch 12 via a connection part 147 in a position different from the connection part 145. The length of the wire 14i is different from that of the wire 14j. Even when such a configuration is employed, the band designing of high flexibility is possible.

Although the example of two-dimensionally periodically arraying the conductor patches 12 each having almost square outer shape in a square lattice shape in two directions orthogonal to each other has been described in the first embodiment, the shape and arrangement of the conductor patches 12 can be properly changed. The outer periphery shape of the opening 13 can be also properly changed.

Figure 13:
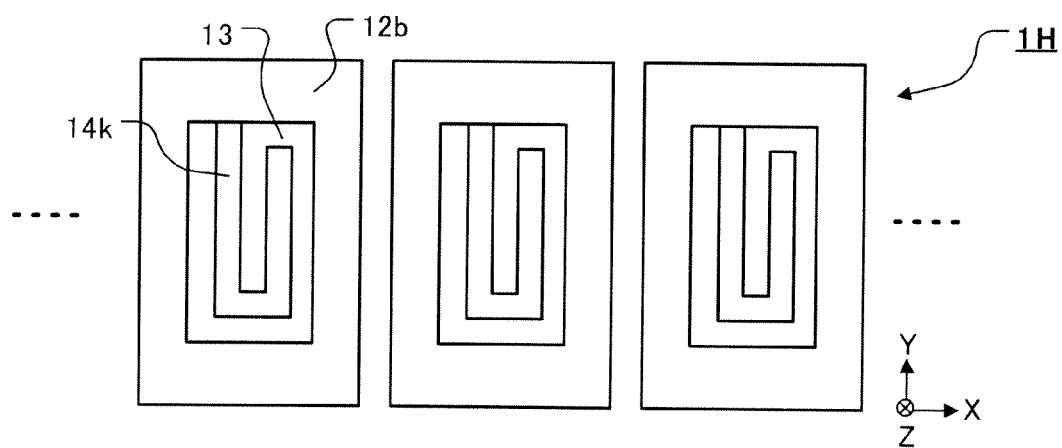
FIG. 13 is a plan view of another structure of the first embodiment.

For example, like a structure 1H shown in FIG. 13, the outer shape of a conductor patch 12b may be almost rectangle and the outer periphery shape of an opening 13b may be an almost rectangle.

Figure 14:
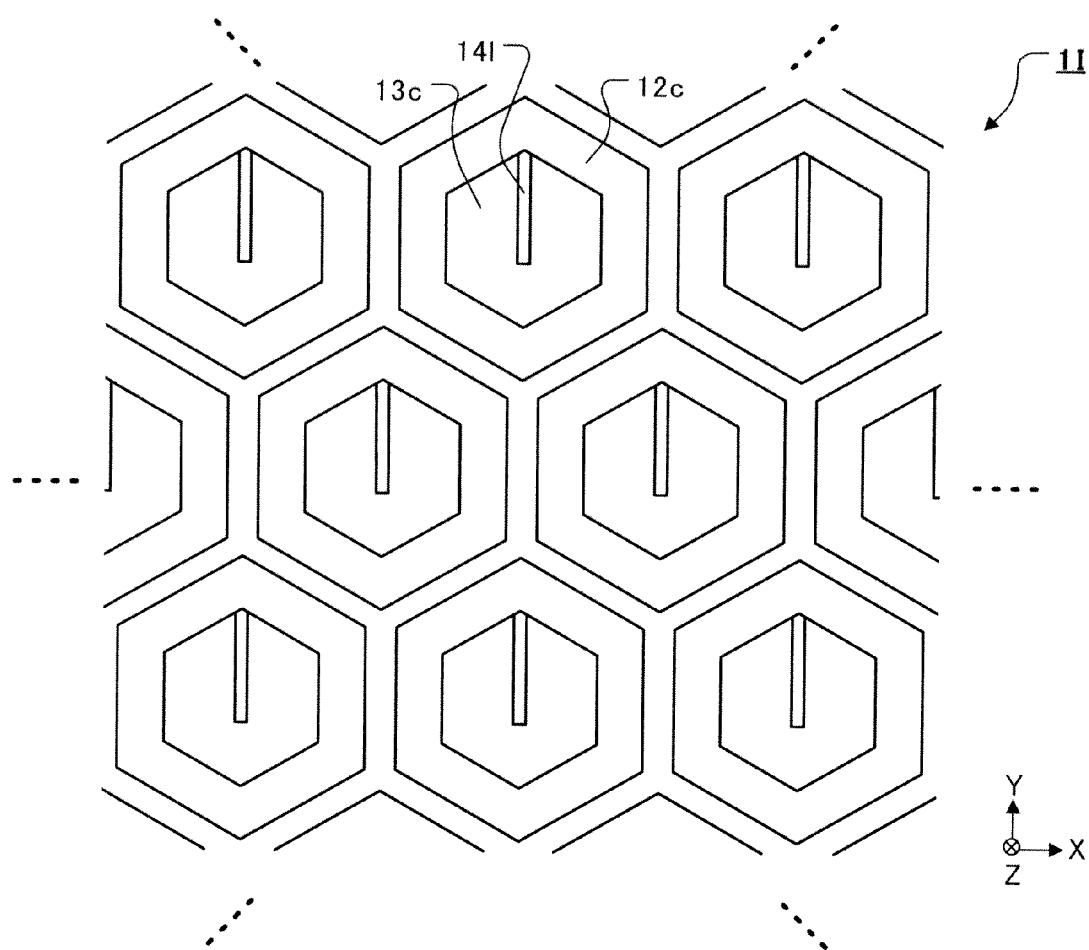
FIG. 14 is a plan view of another structure of the first embodiment.

Like a structure 1I shown in FIG. 14, the outer shape of a conductor patch 12c may be almost regular hexagon, and the outer periphery shape of an opening 13c may be almost regular hexagon.

The outer shape of the conductor patch and the outer periphery shape of the opening may be a polygonal shape such as almost triangle shape or almost regular hexagon shape, a circular shape, an elliptical shape, a corner-rounded polygonal shape, or the like. A shape such as regular triangle, a rectangular shape, or a regular hexagon which can be periodically arrayed in plane endlessly in theory is more advantageous from the viewpoint of increasing the degree of integration than a shape such as circle or ellipse generating a larger wasted region when the shape is periodically arrayed. The conductor patch and the opening may be arrayed in the regular square shape or triangular lattice shape.

The material between the conductor plane 11 and the conductor patch 12 may be any material as long as capacitance is generated between the conductor plane 11 and the conductor patch 12 and is, for example, gas such as air or liquid body. To fill the gap between the conductor plane 11 and the conductor patch 12 with gas or liquid body, for example, the conductor plane 11 is provided on the surface of a first substrate, and the conductor patch 12 is provided on the surface of a second substrate. The first and second substrates are fixed so as to face each other over a gap so that the conductor plane 11 and the conductor patch 12 face each other. The gap between the first and second substrates is filled with atmosphere gas, gas properly selected, liquid body, or the like.

The conductor plane 11 may be attached to the second substrate so that the conductor plane 11 has a gap with respect to the conductor patch 12 provided for the second substrate. For example, the conductor plane 11 may be attached to the second substrate by dielectric adhesive or the like via a spacer to the conductor pattern provided for the second substrate.

On the side opposite in the direction where the conductor plane 11 and the conductor patch 12 face each other, that is, on the outside of the conductor plane 11 and the conductor patch 12, various function films such as a dielectric film or various substrates may be provided so as to cover the conductor plane 11 or the conductor patch 12.

The structure 1 can be also formed by using a glass substrate or silicon substrate as a base substrate and applying the semiconductor technique or the like to the base substrate. For example, the structure 1 can be also produced by sequentially forming the conductor plane 11, the dielectric film, and the conductor pattern 19. The structure 1 may have a configuration that the conductor pattern 19, the dielectric film, and the conductor plane 11 are sequentially formed on the base substrate, and the conductor plane 19 is disposed on the base substrate (base side). For formation of the layers, various film forming methods, photolithography, etching, or the like can be properly used. As the conductive material, for example, a metal such as copper or aluminum can be used. As the dielectric film, for example, a silicon oxide film can be used.

Second Embodiment

Figure 15A:
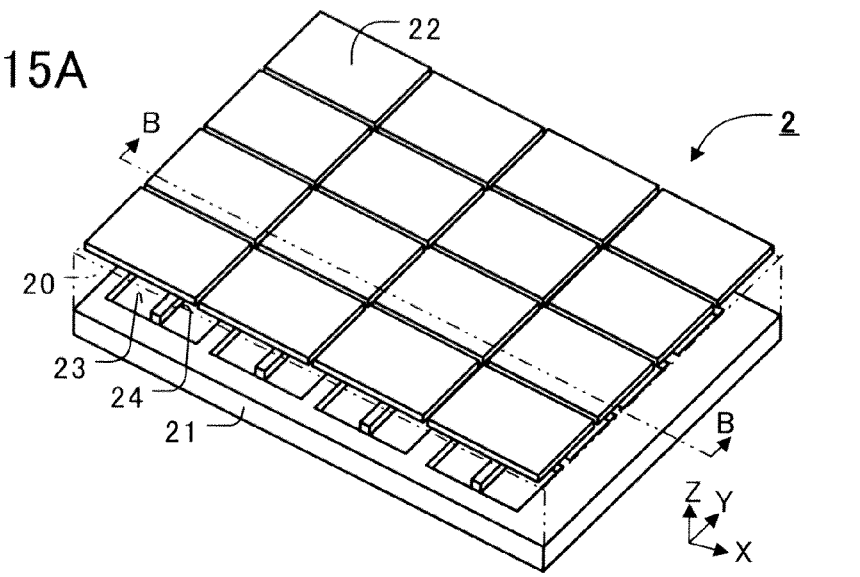
FIGS. 15A, 15B, and 15C are perspective view, plan view, and cross section, respectively, of a structure of a second embodiment.

Next, a structure 2 according to a second embodiment will be described. As shown in FIG. 15A, the structure 2 has a conductor plane 21 as a conductor pattern and a conductor patch 22 as a first conductor element. A plurality of conductor patches 22 are provided so as to face the conductor plane 21.

Figure 15B:
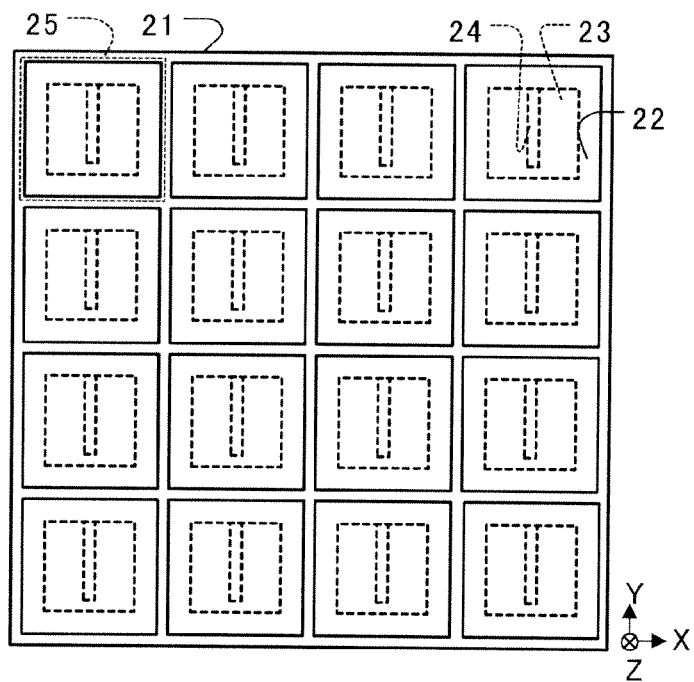

The conductor plane 21 is disposed, for example, so as to face the plurality of conductor patches 22 while sandwiching a dielectric substrate 20. As shown in FIG. 15B, the conductor plane 21 has an opening 23 and a wire 24 as a line part.

Figure 16:
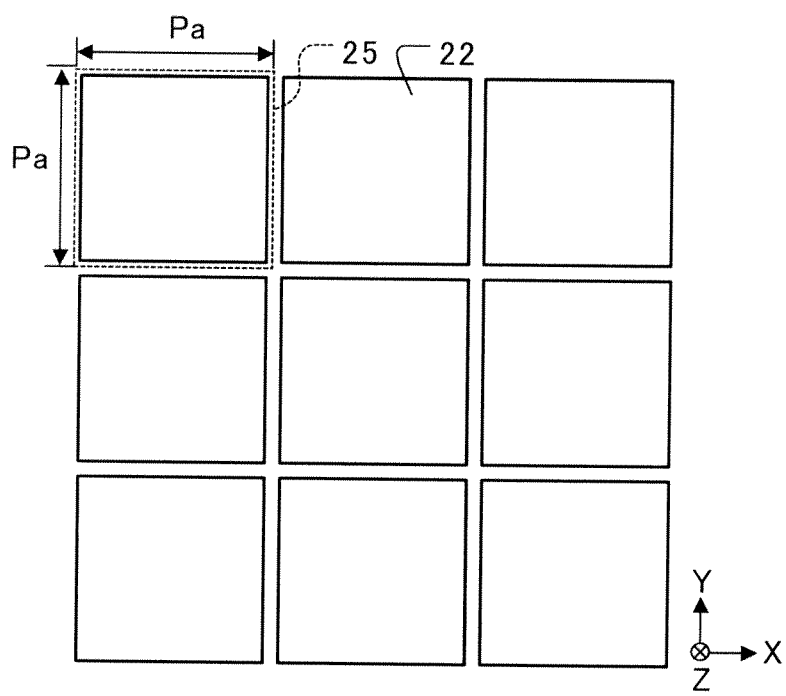
FIG. 16 is a plan view of conductor patches of the second embodiment.

The conductor patches 22 are arranged, as shown in FIG. 16, in a square lattice shape in which the pitch in the x direction is Pa and the pitch in the y direction is Pa. The plurality of conductor patches 22 are disposed so as to be apart from one another.

Figure 17:
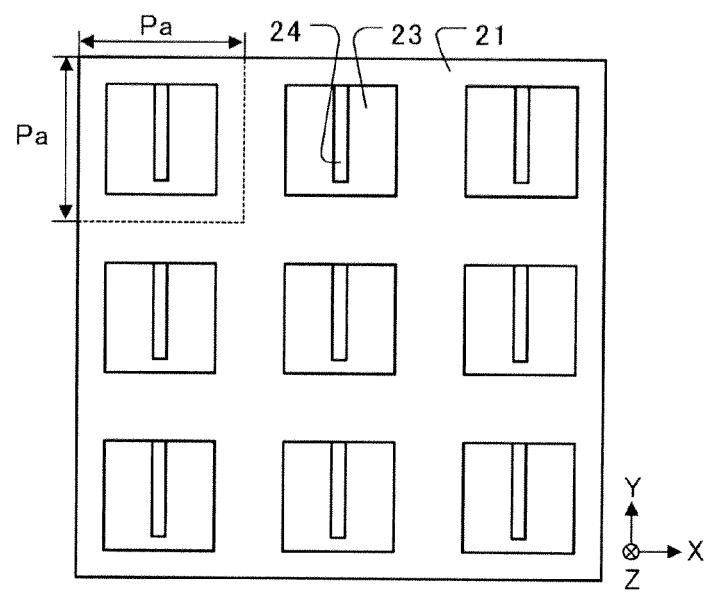
FIG. 17 is a plan view of a conductor plane of the second embodiment.

The wire 24 is provided for each of parts facing the conductor patches 22 in the conductor plane 21. The part on the outside of the opening 23 corresponds to a second conductor element, in the conductor plane 21 in the part facing the conductor patch 22. That is, the structure 2 according to the second embodiment is, as shown in FIG. 17, a structure in which neighboring second conductor elements are continuously integrated.

The opening 23 surrounds the wire 24 except for the start point of the wire 24 (a part of the wire 24). That is, the conductor 21 has the opening 23, and the wire 24 is provided in the opening 23. The conductor plane 21, the opening 23, and the wire 24 are formed in the same plane. The wire 24 is made of the same material as that of the conductor plane 21 of the part other than the wire 24 and is integrally with the conductor plane 21. For example, by periodically forming the plurality of openings 23 in a conductor thin plate, the conductor plane 21 integrated with the wires 24 is formed.

Figure 15C:
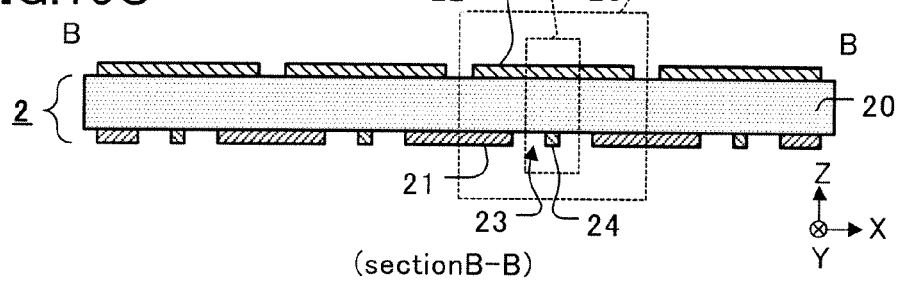

As shown in FIG. 15C, a microstrip line 26 is constructed by the wire 24 and the conductor patch 22 in the part facing the wire 24. The structure 2 has a configuration in which unit cells 25 each as a part having a regular square region whose dimension in the x direction is Pa and whose dimension in the y direction is Pa are periodically two-dimensionally arranged. As described in the first embodiment, the positions of the unit cells 25 are arbitrary. The unit cell 25 has one conductor patch 22, the conductor plane 21 in a part facing the conductor patch 22, the opening 23, and the wire 24. A configuration in which the unit cells 25 are one-dimensionally arranged as shown in HG. 18 may be also employed.

An equivalent circuit diagram of each unit cell 25 in the structure 2 is similar to that of the structure 1 of the first embodiment shown in FIG. 5. The characteristics of the electromagnetic wave propagating between the conductor plane 21 and the conductor patches 22 in the structure 2 are similar to those of the structure 1 shown in FIG. 6. The length of the microstrip line 26 is determined by the shape and dimension of the wire 24. Since the design flexibility of the length of the microstrip line 26 is high, the dispersion relation of the structure can be easily controlled. Thus, for example, it becomes easier to set the band gap in a desired frequency band, and the structure 2 can be made operate as the EBG structure or the left-handed medium in a desired band.

In a manner similar to the first embodiment, the structure 2 having a configuration as described above can realize the CRLH line by a conductive two-layer structure made of a conductive layer including the conductor plane 21 and a conductor layer made by the plurality of conductor patches 22. Therefore, it is unnecessary to provide a conductive via for making the conductor plane 21 and the conductor patches 22 conductive, and the CRLH line having a simple configuration can be realized. As a result, the structure 2 of low cost and high reliability is obtained.

In the structure 2, the longer the length of the microstrip line 26 is, the lower the frequency of the band gap is. Since it is easy to increase the length of the line, the frequency of the band gap can be easily lowered. Therefore, from the viewpoint of realizing low frequency of the band gap, the necessity to widen the opening 23 and necessity to increase the effective dielectric constant of the microstrip line 26 is low. In the structure 2, since the necessity to widen the opening 23 is low, the area of the unit cell can be reduced. Since it is unnecessary to increase the effective dielectric constant of the microstrip line 26, flexibility in selection of the material filling the gap between the conductor patch 22 and the wire 24 is high, and low cost is realized.

In the structure 2, the band of the band gap is easily controlled. Consequently, a band behaving as a magnetic wall which reflects electromagnetic wave in phase and a band behaving as a left-handed medium can be easily controlled. Therefore, the structure 2 can be used as a reflector or a resonator of an antenna in a desired frequency band.

Modifications

The structure 2 of the second embodiment can be also variously modified in a manner similar to the first embodiment.

Figure 19:
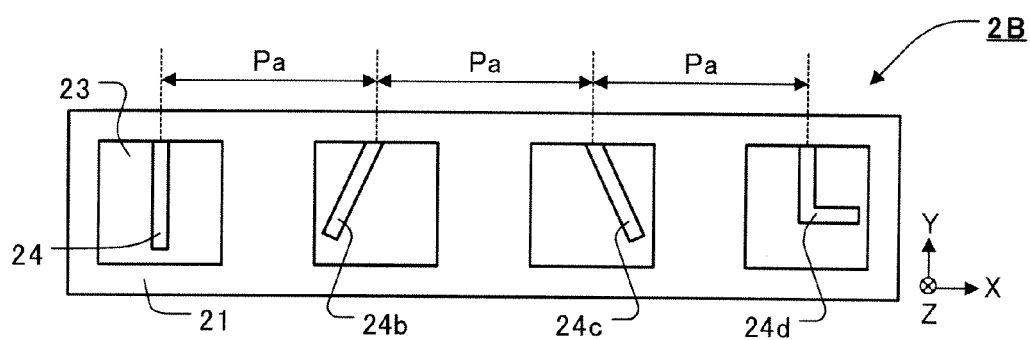
FIG. 19 is a plan view of another structure of the second embodiment.

As shown in FIG. 19, a structure 2B has the conductor plane 21 as a conductor pattern. The conductor plane 21 has openings 23. A line part is provided for each of the openings 23. Wires 24, 24b, 24c, and 24d are provided as line parts. Although the shapes and extension directions are different from one another, the line lengths are almost the same. The start points (connection parts) of the wires 24, 24h, 24c, and 24d are disposed periodically at pitches Pa.

When the lengths of the plurality of wires are almost the same and the positions of the connection parts are almost periodical, an equivalent circuit corresponding to the configuration is the same as that shown in FIGS. 3 and 5. That is, when the lengths of the wires are almost equal to each other, the shape hardly exerts an influence on the electromagnetic wave propagation characteristic. The plane shape of the wire may be, except for an almost linear shape, a polygonal line shape or a curved shape, or a combination of those shapes.

Figure 20:
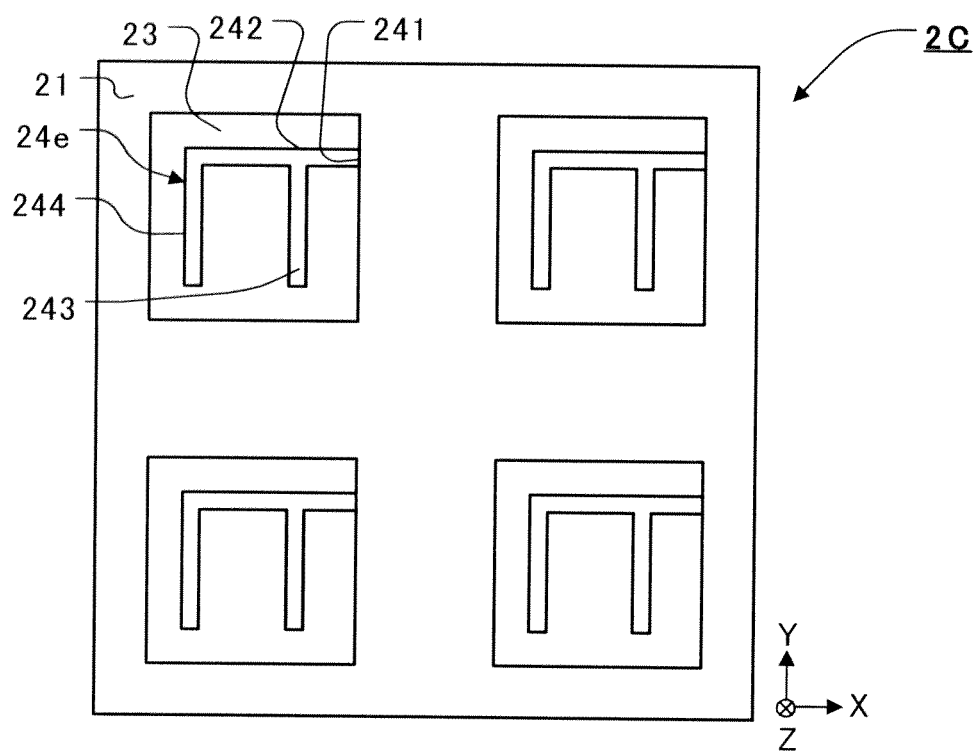
FIG. 20 is a plan view of another structure of the second embodiment.

Like a structure 2C shown in FIG. 20, a wire 24e including a plurality of branch lines may be also employed as the line part. The wire 24e extends from a connection part 241 as a start point to a part surrounded by the opening 23. The wire 24e includes a branch part 242 and further includes branch wires 243 and 244 using the branch part 242 as a start point. The end opposite to the branch part 242, of each of the branch wires 243 and 244 is an open end. The length from the branch part 242 along the branch wire 243 to the open end of the branch wire 243, that is, the length of the branch wire 243 is different from that of the branch wire 211. By constructing the line part including the branch wires whose lengths are different from each other, the frequency at which the admittance Y of the microstrip line 26 changes from the capacitive property to inductive property can be adjusted, and band designing of high flexibility can be realized.

In place of using the branch wire, like a structure 2D shown in FIG. 21, a line part made by a plurality of wires 24i and 24g which are independent of each other may be provided. The wire 24i uses a connection part 245 as a start point. The wire 24g uses a connection part 246 in a position different from the connection part 245 as a start point. The length of the wire 24i is different from that of the wire 24g. Even when such a configuration is employed, the band designing of high flexibility is possible.

As described as a modification of the first embodiment, in the case where it is desired to set the line length long without increasing the dimensions of the unit cell, the meander shape, the loop shape, the spiral shape, or the like may be employed as the shape of the line part. By increasing the line length, the frequency characteristic of the admittance Y in the equivalent circuit diagram of FIG. 3 or 5 can be adjusted and, for example, the frequency of the left-handed band can be lowered.

The plane shape of the conductor patch 22 and the outer shape of the opening 23 may be, except for the regular square shape, a polygonal shape such as triangle shape, rectangular shape, or hexagon shape, circular shape, elliptical shape, or a shape of combination of any of the shapes. The array of the unit cells may be any of the one-dimensional periodical array and the two-dimensional periodical array. In the case of employing the two-dimensional periodical array, array of a triangle lattice shape, array of a regular lattice shape, or the like can be properly selected and employed.

The conductor patch 22 may be disposed to face the conductor plane 21 while sandwiching the dielectric substrate 20 or, as described in the first embodiment, may face the conductor plane 21 while sandwiching gas, liquid body, adhesive, or the like. On the side opposite in the direction where the conductor plane 21 and the conductor patch 22 face each other, that is, on the outside of the conductor plane 21 and the conductor patch 22, various function films such as a dielectric film or various substrates may be provided so as to cover the conductor plane 21 or the conductor patch 22.

The structure 2 can be also formed by using a glass substrate or silicon substrate as a base substrate and applying the semiconductor technique or the like to the base substrate. For example, the structure 2 can be also produced by sequentially forming the conductor plane 21, the dielectric film, and the conductor patch 22. The structure 2 may have a configuration that the conductor patch 22, the dielectric film, and the conductor plane 21 are sequentially formed on the base substrate, and the conductor patch 22 is disposed on the base substrate. For formation of the layers, various film forming methods, photolithography, etching, or the like can be properly used. As the conductive material, for example, a metal such as copper or aluminum can be used. As the dielectric film, for example, a silicon oxide film can be used.

Third Embodiment

Next, a structure according to a third embodiment will be described. The structure of the third embodiment is different from the first embodiment with respect to the point that a third conductor element is provided so as to face two or more neighboring second conductor elements.

Figure 22A:
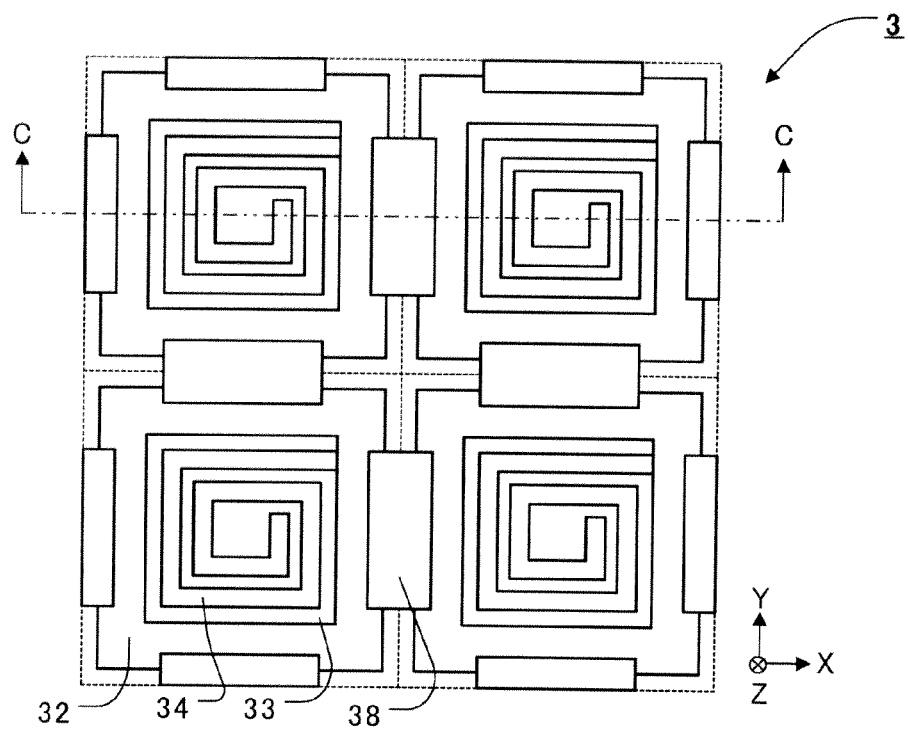
FIGS. 22A and 22B are plan view and cross section, respectively, of a structure of a third embodiment.
Figure 22B:
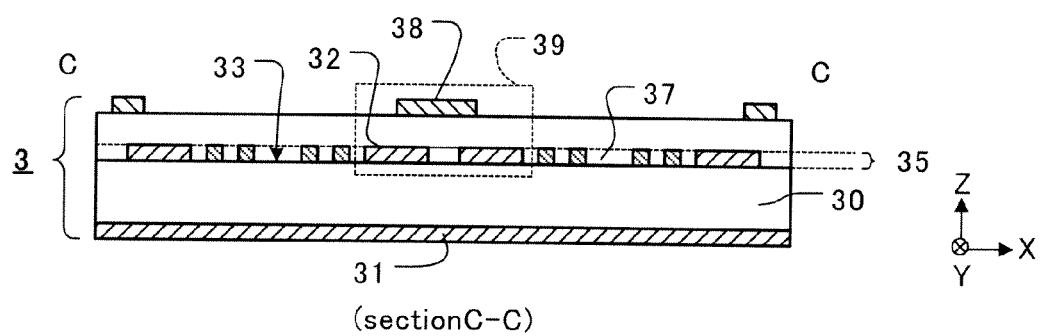

As illustrated in FIGS. 22A and 22B, a structure 31 as a first conductor element, a conductor patch 32 as a second conductor element, an opening 33, and a wire 34 as a line part. A conductor pattern 35 includes the conductor patch 32, the opening 33, and the wire 34. The conductor pattern 35 is disposed, for example, so as to face the conductor plane 31 while sandwiching a dielectric substrate 30. An auxiliary conductor patch 38 is provided as a third conductor element on the side opposite to the conductor plane 31, for the conductor patches 32. The auxiliary conductor patch 38 is disposed so as to overlap two or more conductor patches 32 which are neighboring each other. The auxiliary conductor patch 38 is disposed, for example, so as to face the conductor patch 32 while sandwiching a dielectric layer 37.

The auxiliary conductor patch 38 is provided for two conductor patches 32 which are neighboring in the x direction and provided for two conductor patches 32 which are neighboring in the y direction. The plane shape of the auxiliary conductor patch 38 is an almost rectangular shape whose short side corresponds to a direction in which the conductor patches 32 are apart from each other. Capacitance is generated between the auxiliary conductor patch 38 and each of the two conductor patches 32 overlapping the auxiliary conductor patch 38, and a capacitance part 39 is constructed around the conductor patch 32.

Figure 23:
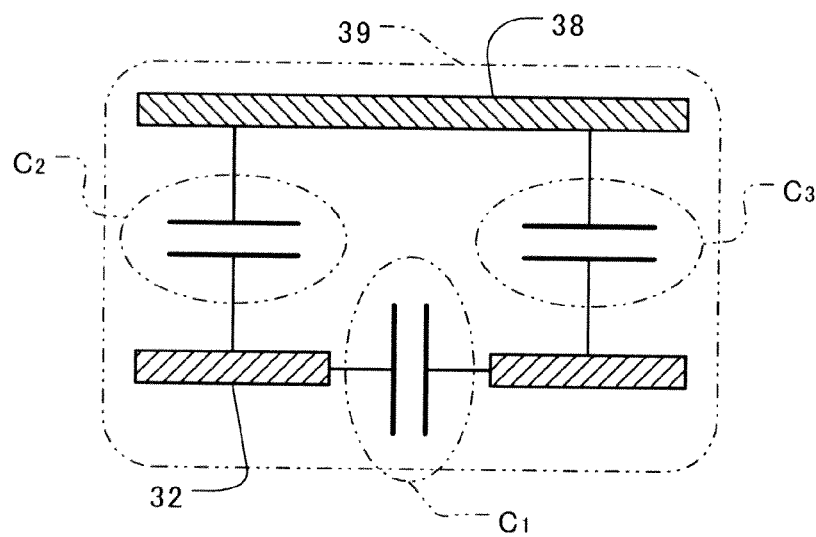
FIG. 23 is a conceptual diagram of a capacitance part between conductor patches of the third embodiment.

The capacitance part 39 has, as shown in FIG. 23, conceptually, a capacitance C1 between the conductor patches 32, a capacitance C2 between one of the neighboring two conductor patches 32 and the auxiliary conductor patch 38, and a capacitance C3 between the other one of the neighboring two conductor patches 32 and the auxiliary conductor patch 38.

Figure 24:
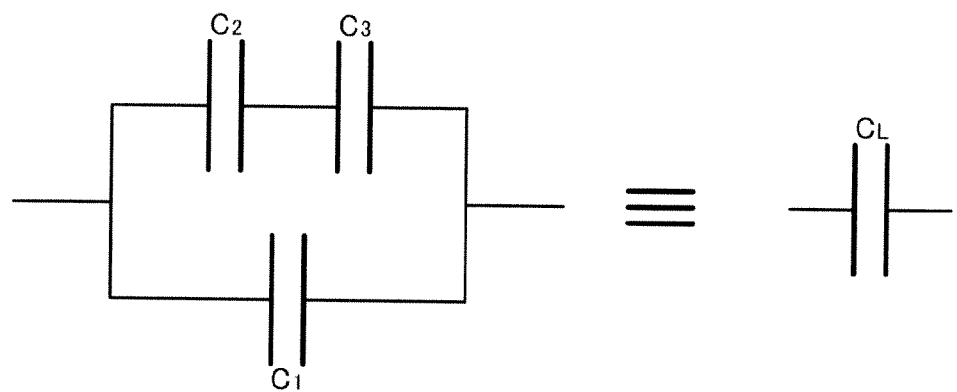
FIG. 24 is an equivalent circuit diagram of the capacitance part between the conductor patches of the third embodiment.

As shown in FIG. 24, the capacitance C2 is connected in series to the capacitor C3 and capacitance generated when the capacitances C2 and C3 are connected in series is connected in parallel to the capacitance C1. That is, by providing the auxiliary conductor patch 38, capacitance CL becomes larger than that in the first embodiment only by capacitance generated by the capacitances C2 and C3 connected in series.

In the equivalent circuit diagrams shown in FIGS. 3 and 5, resonance frequency fse of a series resonance circuit made by the capacitance CL and the inductance LR corresponds to either the lower end or the upper end of the band gap in the dispersion curve shown in FIG. 6. When it is desired to shift the left-handed band to a lower frequency side, in the case where the resonance frequency fse corresponds to the lower end of the band gap, it is sufficient to lower the resonance frequency fse. When it is desired to narrow the band gap, in the case where the resonance frequency fse corresponds to the upper end of the band gap, it is sufficient to lower the resonance frequency fse so that the upper end of the band gap becomes close to the lower end. Particularly, to eliminate the band gap, it is sufficient to lower the resonance frequency fse so that the upper and lower ends of the band gap become the same.

To lower the resonance frequency fse, it is sufficient to increase the capacitance CL or inductance LR. Like the structure 3, when the auxiliary conductor patch 38 is provided, the value of the capacitance CL can be increased without changing the dimensions of the conductor patch 32, the opening 33, and the wire 34. Also by changing the interval between the conductor patch 32 and the auxiliary conductor patch 38 or the area of the auxiliary conductor patch 38 in a part overlapping the conductor patch 32, the values of the capacitances C2 and C3 can be adjusted, and the capacitance CL can be easily adjusted.

The conductor 3 having a configuration as described above does not need a conductor via for making the conductor plane 31 and the conductor pattern 35 conductive like in the first and second embodiments, and can be made a CRLH line behaving as an EBG structure or a left-handed medium in spite of the simple configuration.

In the structure 3, the value of the capacitance CL can be increased without increasing the dimensions of the conductor patch 32, the opening 33, and the wire 34. Therefore, without enlarging the unit cell, the frequency of the band gap can be lowered or the band gap can be narrowed or eliminated. Thus, unit cells can be highly integrated, and the structure 3 can be easily made function as a CRLH line having desired characteristics.

Since the length of the microstrip line of the structure 3 can be easily increased, the frequency of the band gap can be easily lowered. Therefore, from the viewpoint of lowering the frequency of the band gap, it becomes unnecessary to widen the opening 33 and increase the effective dielectric constant of the microstrip line. Thus, in the structure 3, the unit cells can be highly integrated, and low cost can be achieved.

Further, in the structure 3, it is easy to control the bandwidth of the band gap, so that a bandwidth behaving as a magnetic wall reflecting electromagnetic wave in phase or a bandwidth behaving as a left-handed medium can be easily controlled. Thus, the structure 3 can be used as a reflector or a resonator of an antenna in a desired frequency band.

Modifications

As the structure 3, by providing any of the structures of the first and second embodiments or the structures of the modifications with the third conductor element, the value of the capacitance CL can be increased, and the electromagnetic wave propagation characteristic can be easily adjusted. The structure 3 may have a dielectric film, a protection film, various substrates, or the like covering the conductor plane 31 and the auxiliary conductor patch 38. The disposition and shape of the third conductor element can be properly, for example, like modifications as will now be described.

Figure 25:
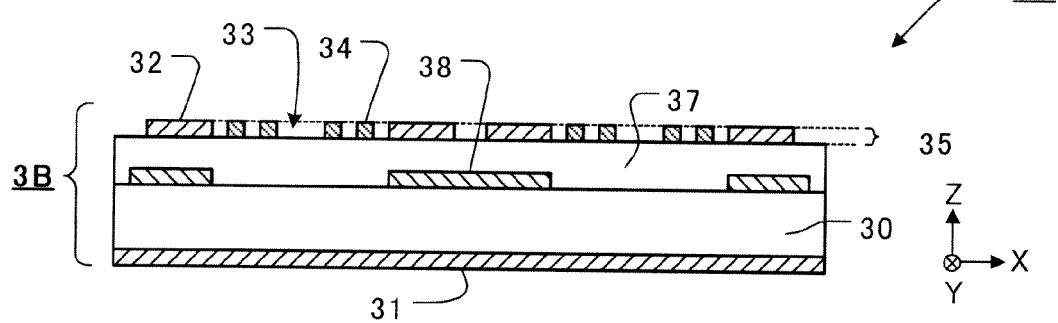
FIG. 25 is a cross section of another structure of the third embodiment.

As shown in FIG. 25, different from the structure 3 of the third embodiment, in a structure 3B, the auxiliary conductor patch 38 is disposed on the same side as the conductor plane 31 with respect to the conductor patch 32. The auxiliary conductor patch 32 is disposed so as to face the conductor plane 31 while sandwiching the dielectric substrate 30. The dielectric layer 37 is disposed on the side opposite to the conductor plane 31, of the auxiliary conductor patch 38. The conductor pattern 35 is disposed so as to sandwich, with the conductor plane 31, the dielectric substrate 30 and the dielectric layer 37. Also with the configuration, in the structure 3B, the value of the capacitance CL can be easily adjusted with high flexibility by the auxiliary conductor patch 38. The third conductor element may be provided on each of the same side and the opposite side of the conductor plane 31, of the conductor patch 32. A dielectric film, a protection film, various substrates, or the like may be provided so as to cover the conductor pattern 35.

Figure 26:
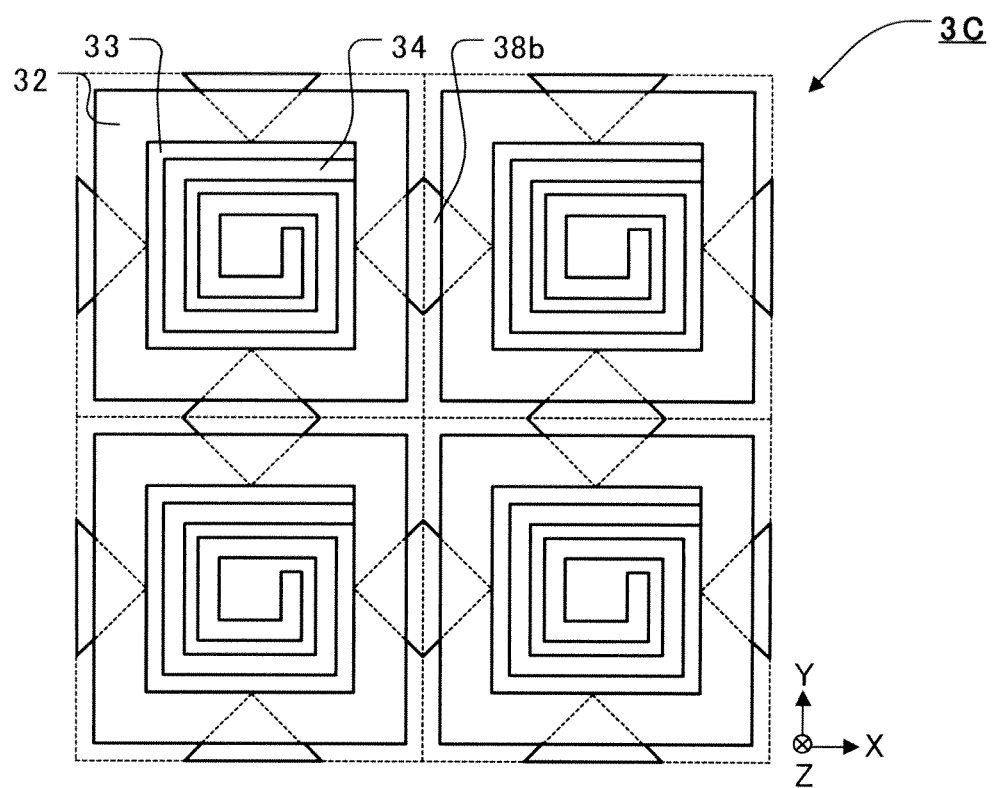
FIG. 26 is a plan view of another structure of the third embodiment.

Although the plane shape of the auxiliary conductor patch 38 is a rectangular shape in the third embodiment, the shape is not limited. The important thing in designing the auxiliary conductor patch 38 is the area of the part facing the conductor patch 32, in the auxiliary conductor patch 38, and the plane shape of the auxiliary conductor patch 38 can be properly changed. For example, like a structure 3C shown in FIG. 26, the plane shape of an auxiliary conductor patch 38b may be a rhombus shape.

Figure 27:
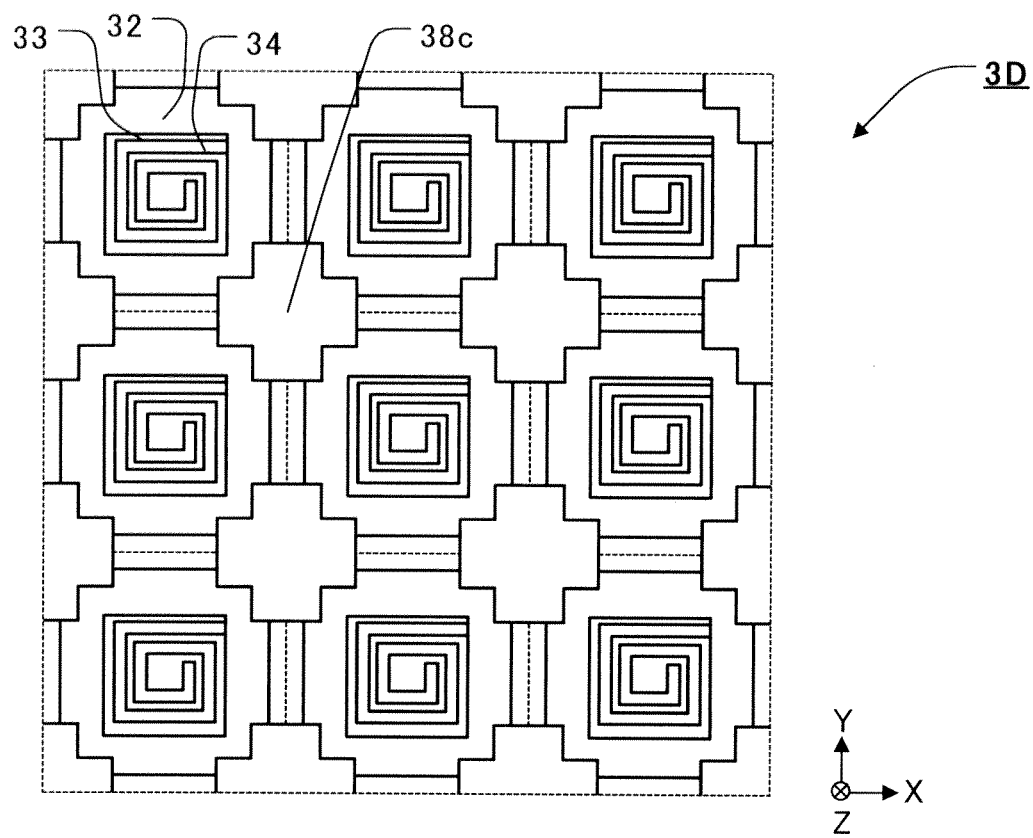
FIG. 27 is a plan view of another structure of the third embodiment.

In the third embodiment, the auxiliary conductor patch 38 is disposed so as to overlap the two neighboring conductor patches 32. The number of conductor patches 32 overlapping the auxiliary conductor patch 38 may be plural and may be three or more. For example, like a structure 3D shown in FIG. 27, an auxiliary conductor patch 38c may overlap four conductor patches 32 in two rows and two columns in the conductor patches 32 in which auxiliary conductor patches 38c are two-dimensionally arrayed.

Figure 28:
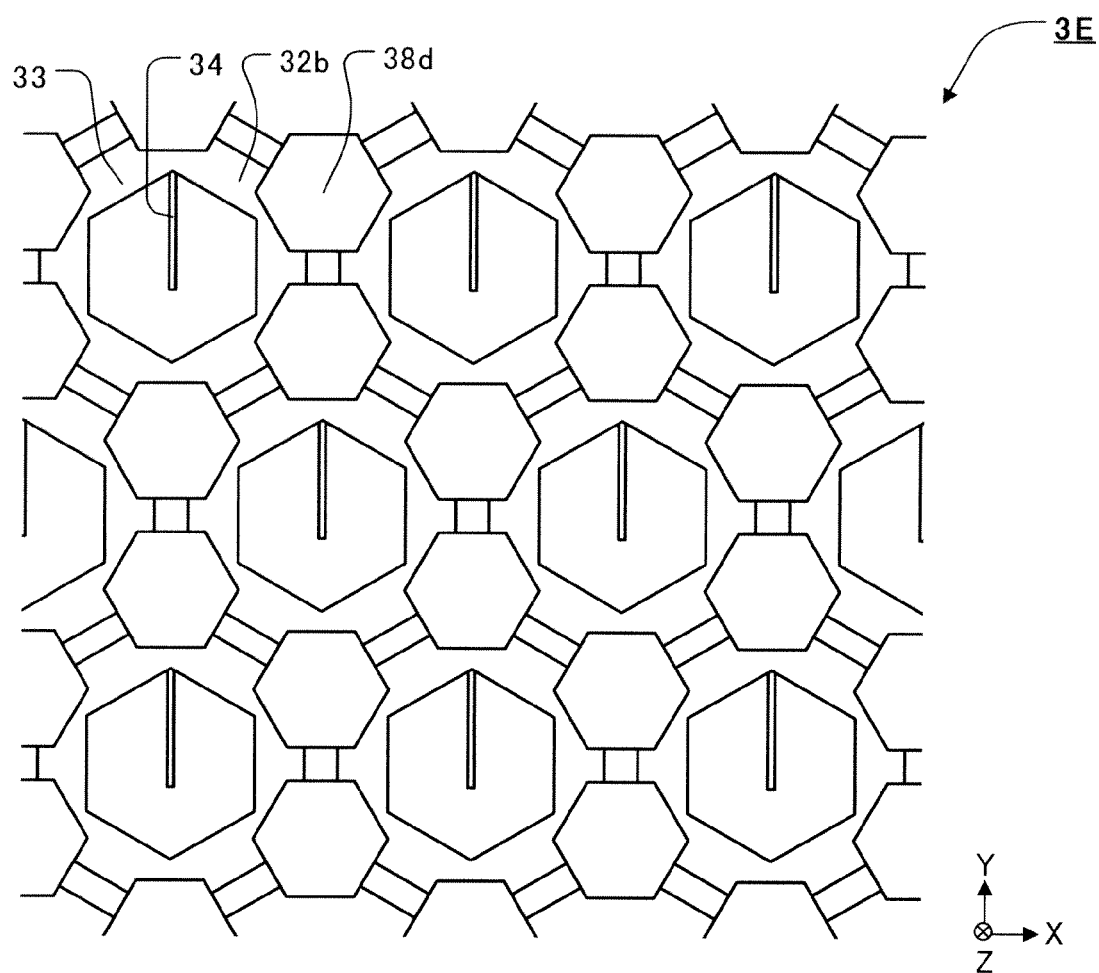
FIG. 28 is a plan view of another structure of the third embodiment.

Further, like a structure 3E shown in FIG. 28, the structure 1I shown in FIG. 14 can be provided with the third conductor element. In the structure 3E, the outer shape of a conductor patch 32b is an almost regular hexagon shape, and the outer peripheral shape of the opening 33 is an almost regular hexagon shape. The conductor patches 32b are arranged in a triangle lattice shape. The outer shape of the auxiliary conductor patch 38d is, although not limited, for example, an almost regular hexagon shape. The auxiliary conductor patch 38d is disposed near a position where the vertexes of three neighboring conductor patches 32b are concentrated and is disposed so as to overlap the three conductor patches 32b.

In the third embodiment, the auxiliary conductor patch 38 is disposed both between the conductor patches 32 in the x direction and between the conductor patches 32 in the y direction. Alternatively, the auxiliary conductor patch 38 may be disposed either between the conductor patches 32 in the x direction or between the conductor patches 32 in the y direction. With such a configuration, the dispersion relation of the CRLH transmission line shows anisotropy between the x direction and the y direction. That is, although the unit structures are arranged symmetrically in the x and y directions, the frequency in the x direction and that in the y direction are different from each other so that ½ wavelength resonance occurs.

Consequently, for example, a dual-band antenna and a multiband antenna can be constructed. A configuration may be also employed in which a first auxiliary conductor patch is disposed between the conductor patches 32 in the x direction, a second auxiliary conductor patch is disposed between the conductor patches 32 in the y direction, and the area of a part overlapping the conductor patch in the first auxiliary conductor patch and that in the second auxiliary conductor patch are different from each other. Also in the configuration, the dispersion relation of the CRLH transmission line shows anisotropy between the x direction and the y direction.

The structure 3 can be also formed by using a glass substrate or silicon substrate as a base substrate and applying the semiconductor technique or the like to the base substrate. For example, the structure 3 can be also produced by sequentially forming the conductor plane 31, the first dielectric film, the conductor patch 32, the second dielectric film (dielectric layer 37), and the auxiliary conductor patch 38 on the substrate. For formation of the layers, various film forming methods, photolithography, etching, or the like can be properly used. As the conductive material, for example, a metal such as copper or aluminum can be used. As the first and second dielectric films, for example, silicon oxide films can be used.

Fourth Embodiment

Next, a structure according to a fourth embodiment will be described. The structure of the fourth embodiment is different from that of the third embodiment with respect to the point that the structure of the second embodiment is provided with the third conductor element.

Figure 29A:
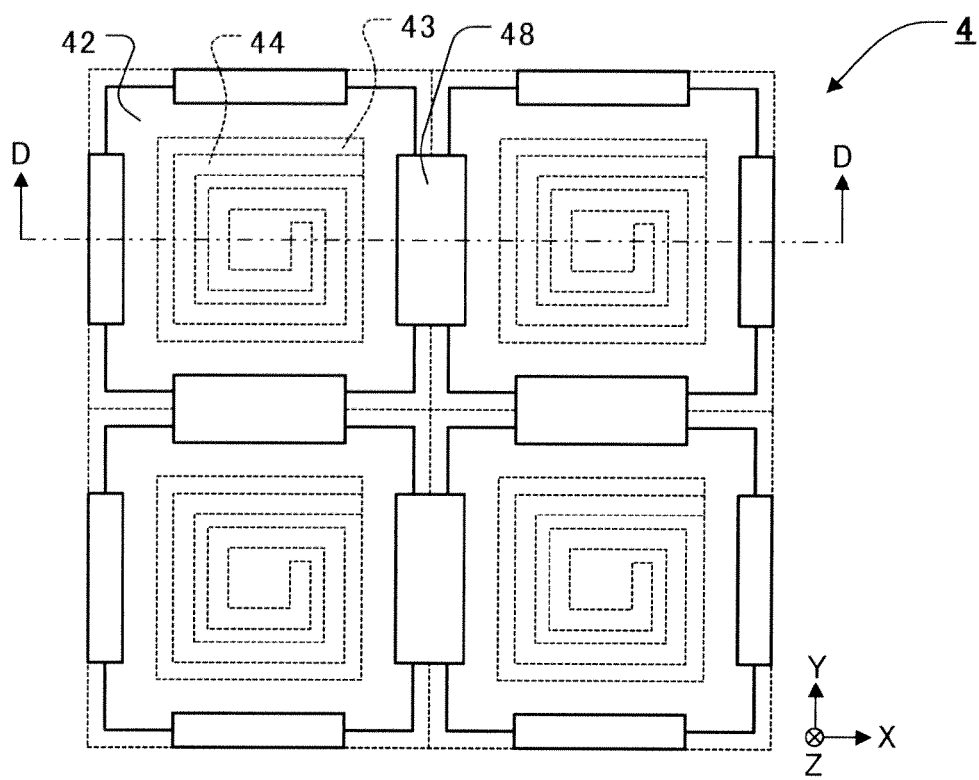
FIGS. 29A and 29B are plan view and cross section, respectively, of a structure of a fourth embodiment.
Figure 29B:
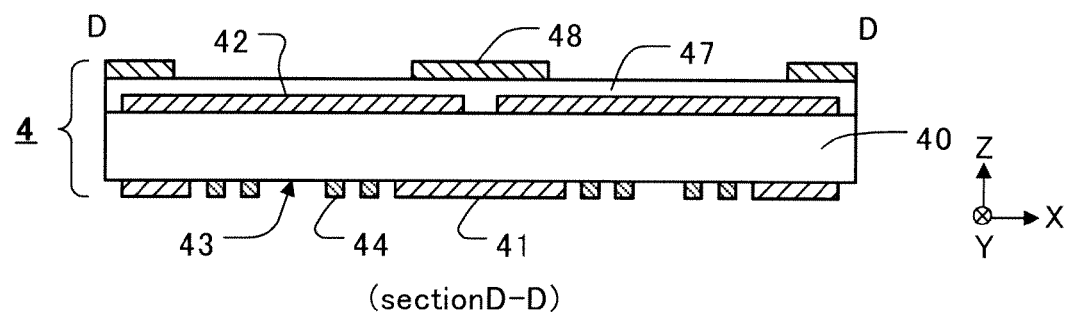
Figure 30A:
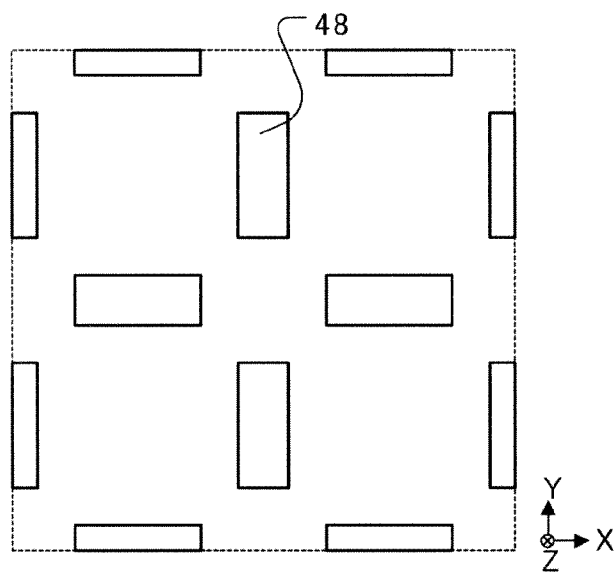
FIGS. 30A, 30B, and 30C are plan view of auxiliary patches, plan view of conductor patches, and plan view of a conductor pattern, respectively, of the structure of the fourth embodiment.
Figure 30B:
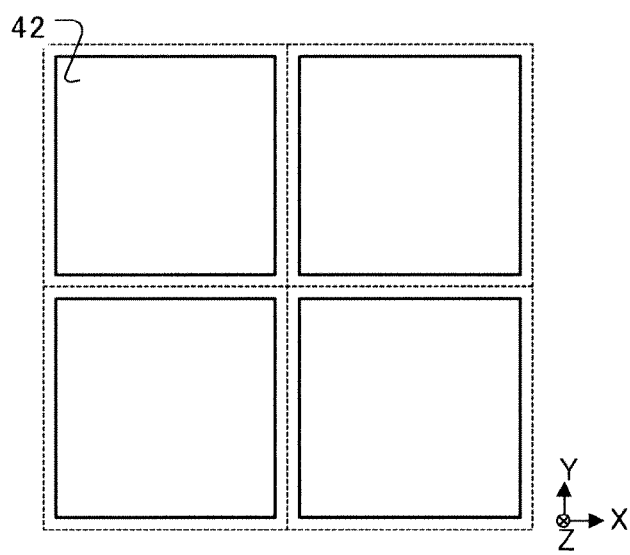
Figure 30C:
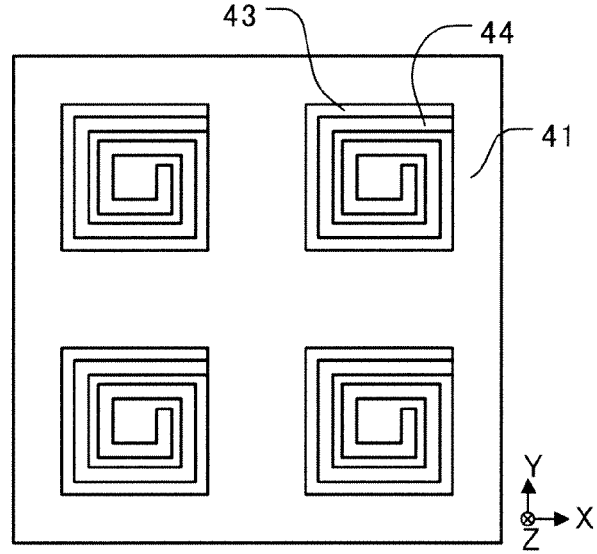

As shown in FIGS. 29A and 29B, a structure 4 has a conductor plane 41 as a conductor pattern and a conductor patch 42 as a first conductor element. A plurality of conductor patches 42 are provided so as to face the conductor plane 41. The conductor patches 42 are disposed, for example, to face the conductor plane 41 while sandwiching a dielectric substrate 40. As shown in FIG. 30C, the conductor plane 41 has an opening 43 and a wire 44 as a line part. The wire 44 is provided for each of parts facing the conductor patches 42, in the conductor plane 41. An auxiliary conductor patch 48 is provided as a third conductor element on the side opposite to the conductor plane 41, of the conductor patch 42. The auxiliary conductor patch 48 is disposed so as to overlap two or more conductor patches 42 neighboring each other. The auxiliary conductor patch 48 is disposed, for example, so as to face the conductor patch 42 while sandwiching the dielectric layer 47 and the like.

In a manner similar to the first and second embodiments, the structure 4 having a configuration as described above does not need a conductor via for making the conductor plane 41 and the conductor patch 42 conductive, and can be made a CRLH line behaving as an EBG structure or a left-handed medium in spite of the simple configuration.

In the structure 4, in a manner similar to the third embodiment, the capacitance CL can be adjusted easily without increasing the size of the unit cell. Thus, unit cells can be highly integrated, and the structure 4 can be easily made function as a CRLH line having desired characteristics.

Since the length of the microstrip line of the structure 4 can be easily increased, the frequency of the band gap can be easily lowered. Therefore, from the viewpoint of lowering the frequency of the band gap, it becomes unnecessary to widen the opening 43 and increase the effective dielectric constant of the microstrip line. Thus, in the structure 4, the unit cells can be highly integrated, and low cost can be achieved.

Further, in the structure 4, it is easy to control the bandwidth of the band gap, so that a bandwidth behaving as a magnetic wall reflecting electromagnetic wave in phase or a bandwidth behaving as a left-handed medium can be easily controlled. Thus, the structure 4 can be used as a reflector or a resonator of an antenna in a desired frequency band.

Modifications

The structure 4 can be modified or changed in a manner similar to the third embodiment. For example, the auxiliary conductor patch 48 may be provided on the same side as the conductor plane 41, of the conductor patch 42. The third conductor element may be provided on each of the same side and the opposite side as/to the conductor plane 41, of the conductor patch 42.

The plane shape of the auxiliary conductor patch 48 may be any of a polygonal shape such as a rhombus shape or a hexagon shape, a circular shape, an oval shape, or a shape of combination of the shapes.

The disposition in the x direction and the disposition in the y direction of the auxiliary conductor patches 48 or the shapes or the like may be made different so that the capacitor CL between the conductor patches 42 has anisotropy.

The structure 4 may be provided with a dielectric film, a protection film, various substrates, or the like covering the conductor plane 41 or the auxiliary conductor patch 48.

The structure 4 can be also formed by using a glass substrate or silicon substrate as a base substrate and applying the semiconductor technique or the like to the base substrate. For example, the structure 4 can be also produced by sequentially forming the conductor plane 41, the first dielectric film, the conductor patch 42, the second dielectric film (dielectric layer 47), and the auxiliary conductor patch 48 on the substrate. For formation of the layers, various film forming methods, photolithography, etching, or the like can be properly used. As the conductive material, for example, a metal such as copper or aluminum can be used. As the first and second dielectric film, for example, a silicon oxide film can be used.

Fifth Embodiment

Next, an antenna according to a fifth embodiment will be described. The antenna of the present invention has the structure according to the invention.

Figure 31A:
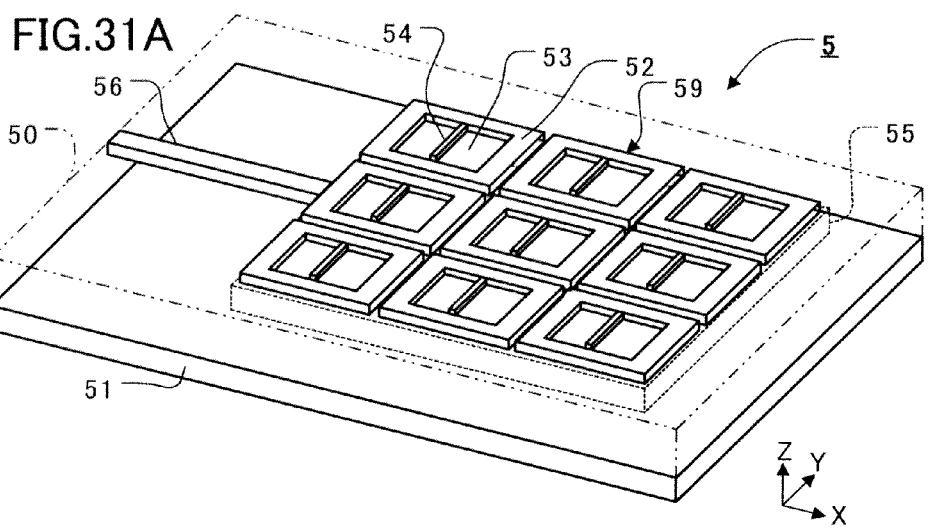
FIGS. 31A, 31B, and 31C are perspective view, plan view, and cross section, respectively, of an antenna of a fifth embodiment.
Figure 31B:
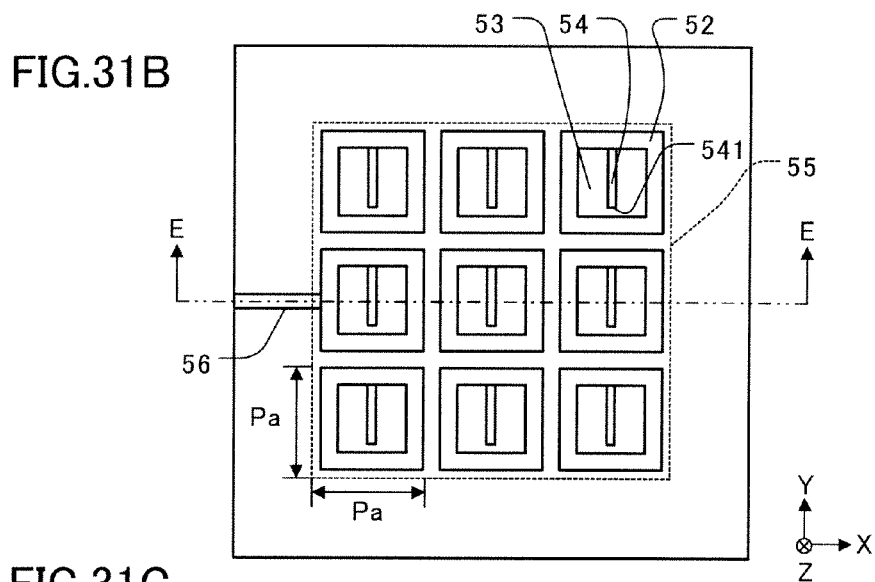
Figure 31C:
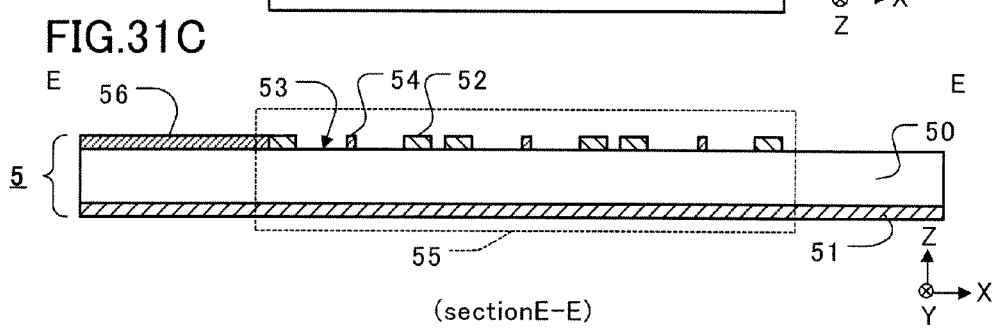

As shown in FIG. 31A, an antenna 5 has a structure 55 according to the present invention and a power feeder 56. The structure 55 has a conductor plane 51 as a first conductor element and a conductor pattern 59. As shown in FIG. 31C, the conductor pattern 59 is disposed, for example, so as to face the conductor plane 51 while sandwiching a dielectric substrate 50. As shown in FIG. 31B, the conductor pattern 59 has a conductor patch 52 as a second conductor element, an opening 53, and a wire 54 as a line part having an open end 541. The conductor pattern 59 includes a plurality of conductor patches 52. The opening 53 and the wire 54 are provided for each conductor patch 52.

The structure 55 is a component of the resonator in the antenna 5. As for the dispersion relation of the structure 55, on the basis of a design value of the operation frequency of the antenna 5, it is designed so that the structure 55 behaves as a left-handed medium for the electromagnetic wave of the design value.

In the embodiment, the power feeder 56 is connected to one of the conductor patches 52. The structure 55 is constructed by nine unit cells of a two-dimensional array made of three units in the x direction and three units in the y direction. When the pitch of the unit cells is Pa, the plane shape of the resonator is an almost square in which the dimension in the x direction is 3 Pa and the dimension in the y direction is 3 Pa.

It is known that, in a resonator constructed by a square-shaped conductor whose one side has length of N×Pa, a dielectric plate, and a conductor plate, the frequency at the wave number $\beta=n\pi/(N\times Pa)$ (n=1, 2, ..., N−1) on the dispersion curve corresponds to resonance frequency. This fact similarly applies to the structure 55. In the case of constructing a resonator whose one side has length of N×Pa by two-dimensionally arranging N×N pieces of unit cells at the lattice constant (pitch) Pa, the frequency at the wave number β=nπ/(N×Pa) (where n=1, 2, . . . , N−1) on the dispersion curve corresponds to resonance frequency. Particularly, the frequency at β=π(N×Pa) corresponds to half-wavelength resonance frequency.

Figure 32:
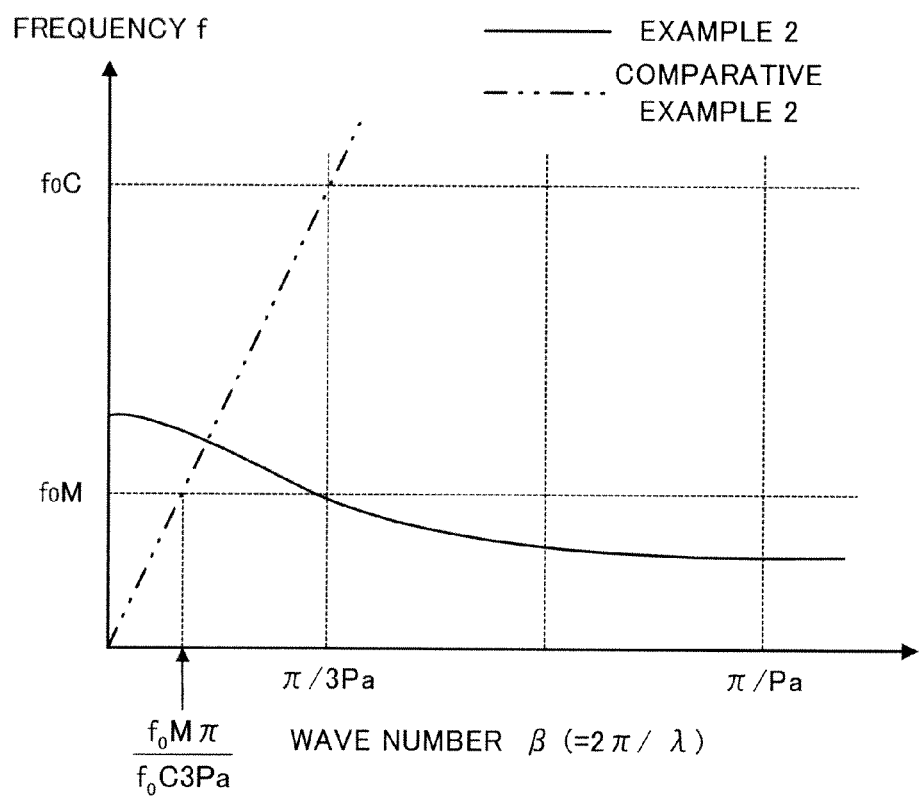
FIG. 32 is a graph showing the dispersion relation of a structure of the fifth embodiment.

The dispersion relation between the resonance frequency of the antenna 5 and the electromagnetic wave propagation is a correspondence relation as shown in FIG. 32. The solid line indicates the dispersion relation of example 2, which indicates the dispersion relation (dispersion curve) in the structure 55. The chain line indicates the dispersion relation of comparative example 2 in which a square-shaped conductor is disposed in place of the conductor patch 52 and the wire 54, that is, indicates the dispersion relation in a parallel plate in which two conductor plates are disposed parallel to each other.

For example, when N=3, that is, the length of one side of the resonator is 3 Pa, the frequency at β=π/(3 Pa) of dispersion corresponds to the half-wavelength resonance frequency. It is understood that half-wavelength resonance frequency $f_0C$ in the resonator of the comparative example 2 is higher than half-wavelength resonance frequency $f_0M$ in the resonator of the comparative example 2. In the configuration of the comparative example 2, to set the half-wavelength resonance frequency to $f_0M$, the dimension (length of one side) of the resonator has to be set to $f_0C/f_0M$ times. In other words, the size of the resonator constructed by the structure according to the present invention can be reduced to $f_0C/f_0M$ as compared with that of the conventional resonator and can be dramatically reduced.

It is known that, in the case where a band gap exists in the dispersion relation of a CRLH line, Bloch impedance of the CRLH line has sharp frequency independence. Consequently, when there is a band gap, it may be difficult to obtain impedance matching of a wide range with a power feeder. For such a reason, it is preferable to design a CRLH line which is operated as a resonator of an antenna so that the resonance frequency in the admittance Y and that in the impedance Z are matched and a condition of making the band gap disappear is satisfied. To adjust the resonance frequency, the configuration of providing the third conductor element described in the third and fourth embodiments is particularly effective.

In the antenna 5 having a configuration as described above, the resonator is constructed by the structure 55 behaving as a left-handed medium. Therefore, the resonator in the antenna 5 can be made much smaller than the conventional one constructed by a right-handed medium, and the entire antenna can be dramatically downsized. Since the resonator in the antenna 5 is constructed by the structure 55 according to the present invention, the configuration of the resonator becomes simple, the cost is low, and reliability is high.

Modifications

Figure 18:
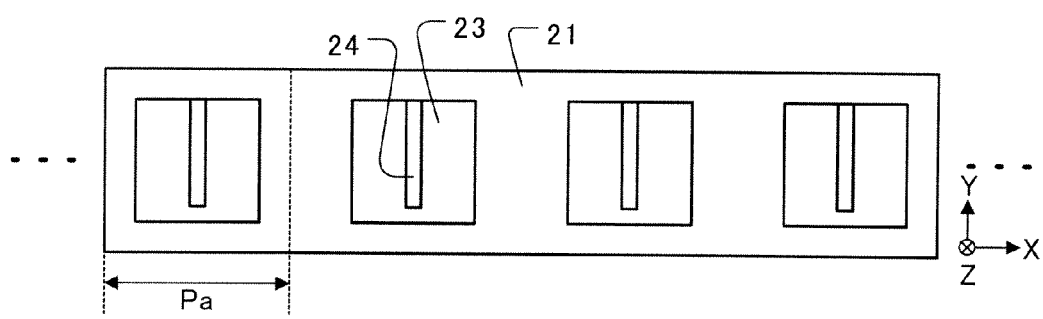
FIG. 18 is a plan view of unit cells arranged one-dimensionally.

As the resonator of the antenna 5, any of the structures of the first to fourth embodiments and the structures of the modifications may be employed. For example, the structure in which the unit cells are two-dimensionally periodically-arrayed (refer to FIGS. 1B and 15B) may be employed, or the structure in which the unit cells are one-dimensionally periodically arrayed (refer to FIGS. 2 and 18) may be employed. Antennas of some modifications will now be described.

Figure 33A:
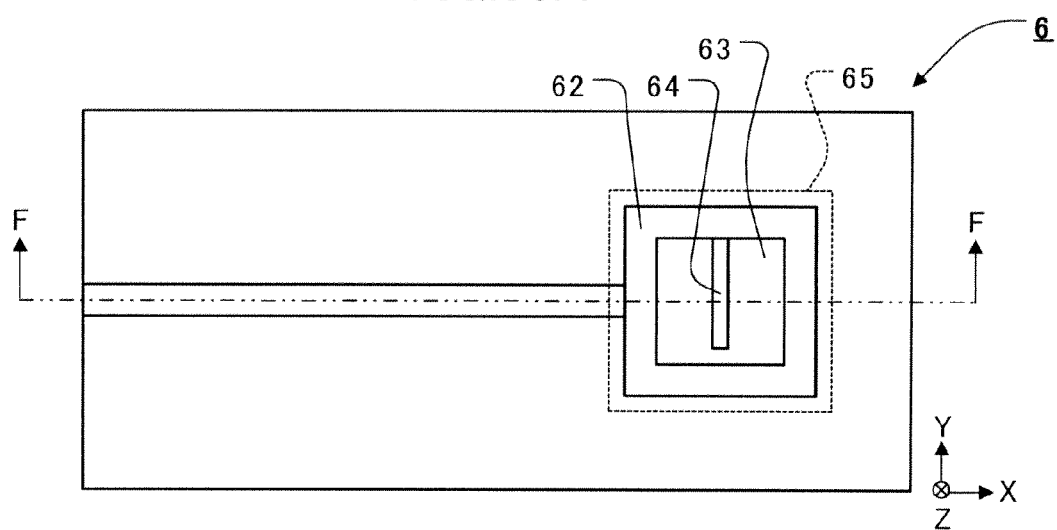
FIGS. 33A and 33B are plan view and cross section, respectively, of another antenna of the fifth embodiment.
Figure 33B:
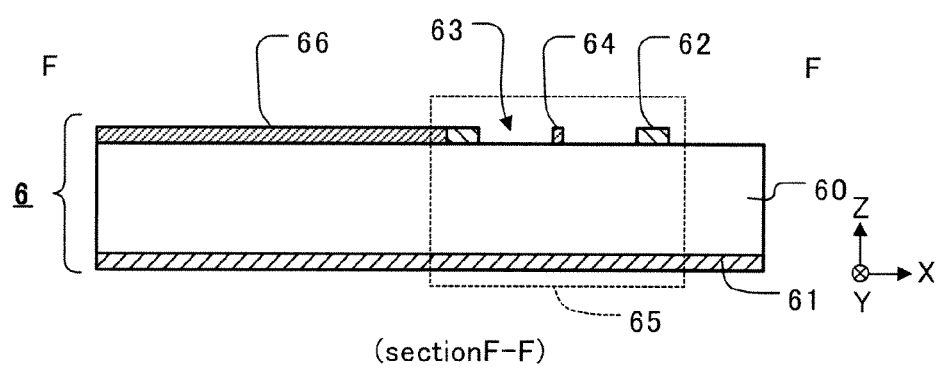

An antenna 6 as a modification shown in FIGS. 33A and 33B may be also employed. The antenna 6 is different from the antenna 5 of the fifth embodiment with respect to the point that a resonator is constructed by one unit cell.

The antenna 6 has a structure 65 and a power feeder 66. The structure 65 has a conductor plane 61 as a first conductor element, a conductor patch 62 as a second conductor element, an opening 63, and a wire 64 as a line part. A conductor pattern including the conductor patch 62, the opening 63, and the wire 64 is disposed so as to face the conductor plane 61 while sandwiching a dielectric substrate 60.

Figure 34A:
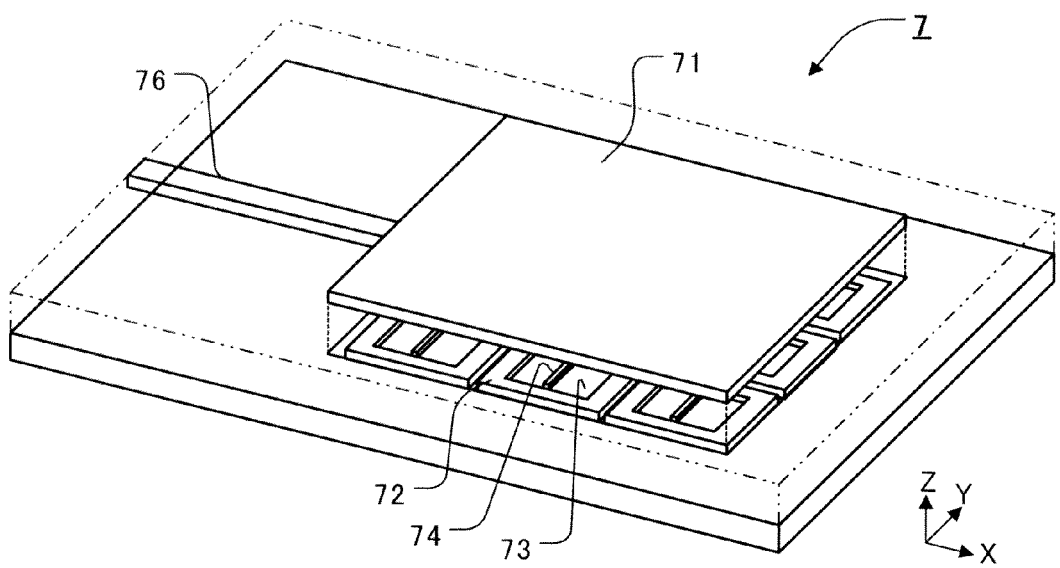
FIGS. 34A and 34B are perspective view and plan view, respectively, of another antenna of the fifth embodiment.
Figure 34B:
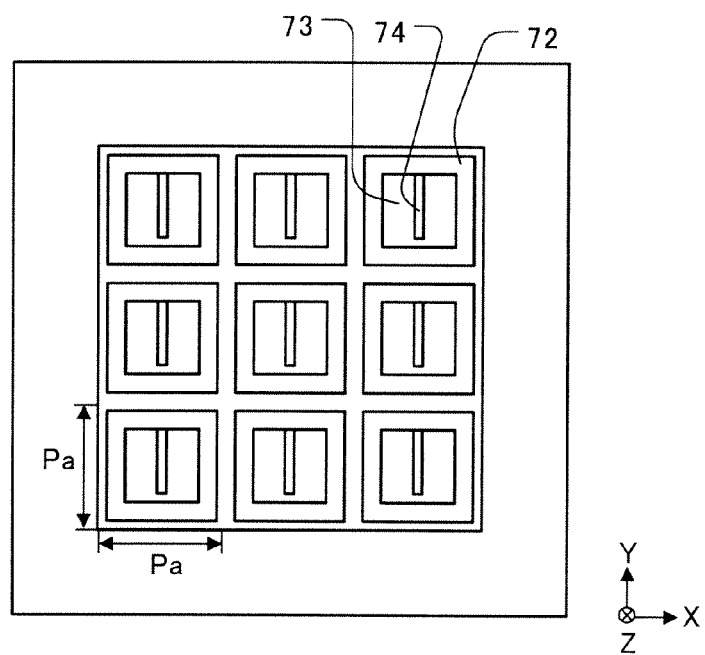

An antenna 7 as a modification shown in FIGS. 34A and 34B may be also used. The antenna 7 is different from the antenna 5 of the fifth embodiment with respect to the point that the first conductor element and the power feeder are electrically connected to each other.

The antenna 7 has a structure 75 and a power feeder 76. The structure 75 has a conductor plane 71 as a first conductor element, a conductor patch 72 as a second conductor element, an opening 73, and a wire 74 as a line part. The power feeder 76 is conducted with the conductor plane 71. A conductor pattern including the conductor patch 72, the opening 73, and the wire 74 is disposed so as to face the conductor plane 71. The conductor pattern uses, for example, a conductor thin plate as a base plate. A trench is formed in each of the x and y directions of the base plate, and a part surrounded by the trenches is used as the conductor patch 72. The wire 74 integrated with the conductor patch 72 is formed by forming the opening 73 in the same process as the trench formation or another process.

As a method of feeding power to the resonator of the antenna, a known feeding method of a microstrip antenna or the like can be properly selected.

Figure 35:
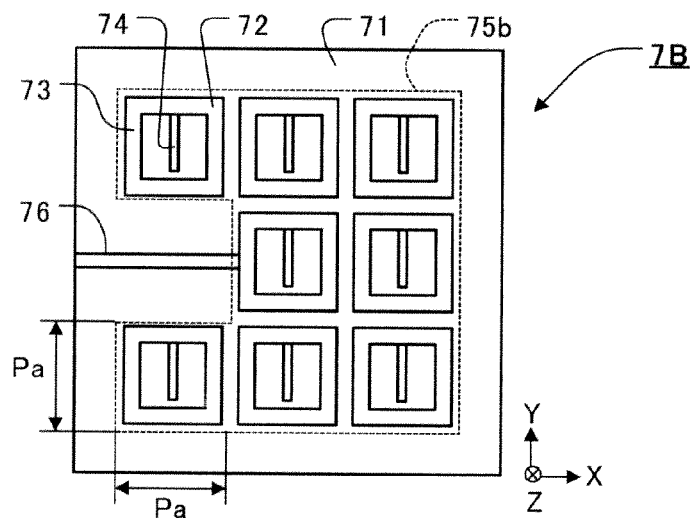
FIG. 35 is a plan view of another antenna of the fifth embodiment.

An antenna 7B as a modification as shown in FIG. 35 may be employed. The antenna 7B has a structure 75B and a power feeder 76. The structure 75B has eight unit cells. The structure 75B has a configuration that a unit cell is not disposed in one of lattice points of eight outer peripheral parts except for the center part in a square-lattice-shaped array of three rows and three columns. The power feeder 76 extends to a part in which no unit cell is disposed and is electrically connected to the conductor patch 72 of the unit cell disposed in the center part.

In the antenna 7B having such a configuration, the characteristic impedance of the microstrip line can be made close to the input impedance of the antenna 7B and, as a result, radiation efficiency can be improved.

Figure 36:
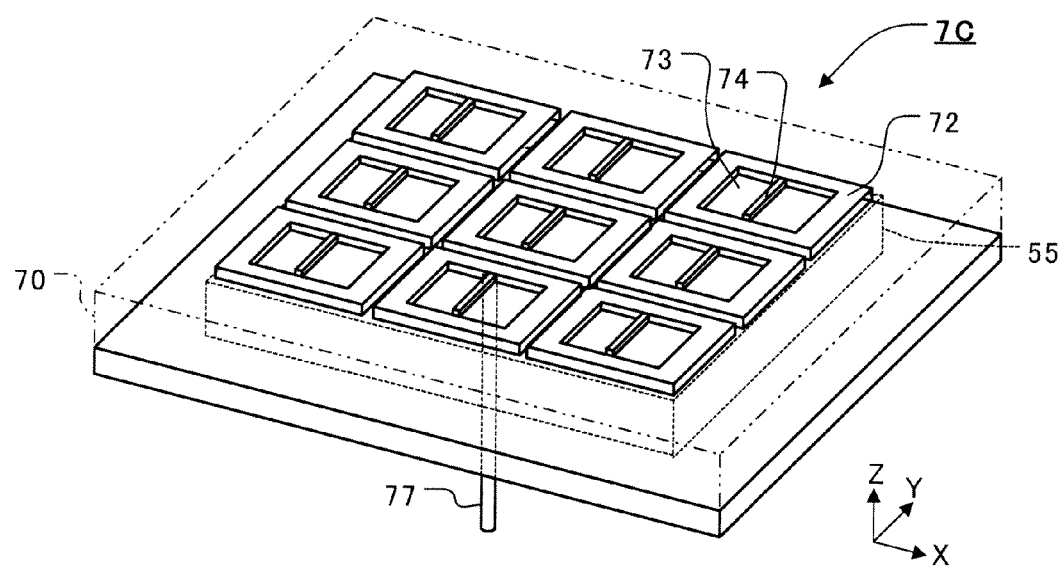
FIG. 36 is a perspective view of another antenna of the fifth embodiment.

An antenna 7C as a modification as shown in FIG. 36 may be also employed. The antenna 7C has the structure 55 and a coaxial cable 77 as a power feeder. The coaxial cable 77 has a signal line (for example, inner conductor) and a ground line (outer conductor). The signal line is electrically connected to one of the conductor patches 72, for example, through a conductor via. The ground line is electrically connected to the conductor plane 71. Although the antenna 7C having a such configuration has a conductor via for power feeding, a conductor via for connecting the conductor plane 71 and the conductor patch 72 is unnecessary. If a conductor via for connecting the conductor plane and the conductor patch is provided, the antenna 7 has to have a conductor via for each of the conductor patches. As the number of unit cells increases, the more an inconvenience such as increase in manufacture cost or deterioration in connection reliability is caused. Since the antenna 7C uses the structure according to the present invention, such an inconvenience can be avoided.

Figure 37:
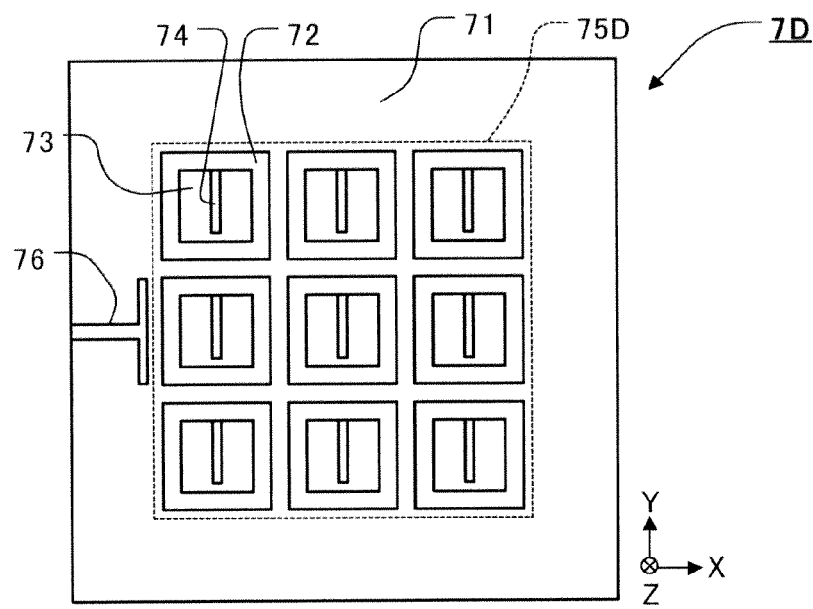
FIG. 37 is a plan view of another antenna of the fifth embodiment.

An antenna 7D as a modification as shown in FIG. 37 may be also employed. The antenna 7D has a structure 75D and the power feeder 76. The structure 75D has nine unit cells arranged in a square lattice shape of three rows and three columns. The power feeder 76 feeds power to the unit cells by capacitive coupling with a unit cell disposed in the outer periphery. In the modification, the power feeder 76 has an almost T shape and has a tip part which comes close to the unit cell in a non-contact manner and a line part which is continuous to the tip part. The tip part is provided along one unit cell disposed in the center of the outer periphery of the structure. The conductor patch 72 of the unit cell and the tip part are coupled via capacitance, and power can be fed to the unit cell.

Sixth Embodiment

Next, an antenna according to a sixth embodiment will be described. The antenna of the sixth embodiment is different from that of the fifth embodiment with respect to the point that the structure according to the present invention is employed as a reflector. A configuration example of applying the structure according to the present invention to an inverted-L-shaped antenna will be described here. In the embodiment, the same reference numerals are designated to components similar to those of the foregoing embodiments and their detailed description will not be repeated.

Figure 38:
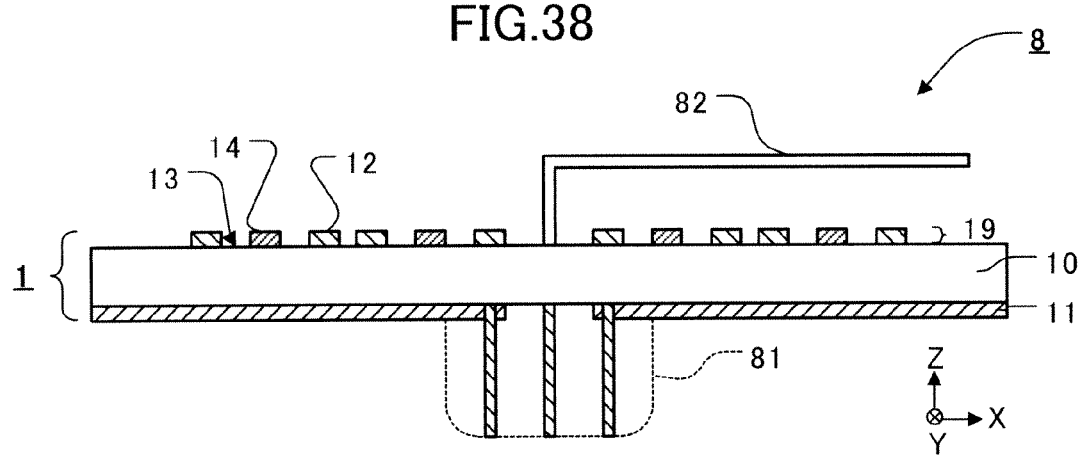
FIG. 38 is a cross section of an antenna of a sixth embodiment.

As shown in FIG. 38, an antenna 8 has the structure 1 of the first embodiment as the structure according to the present invention, a coaxial cable 81, and an antenna element 82. The antenna 8 is constructed by using the dielectric substrate 10 having an almost plate shape.

The conductor pattern 19 is provided on one of faces of the dielectric substrate 10, and the conductor plane 11 is provided on the other face. The structure 1 of the invention has the conductor plane 11 and the conductor pattern 19. The dispersion relation of the structure 1 is designed so that the entire frequency band corresponding to the use frequency of the antenna 8 is included in the band gap.

The antenna element 82 projects from one of the faces of the dielectric substrate 10 in the direction normal to the face, is bent at a position apart from the substrate, and extends in the plane direction of the substrate. The part of the tip of the bent part includes a radio emission face and is disposed close to the conductor pattern 19.

The coaxial cable 81 has a signal line and a ground line. The coaxial cable 81 is connected to one of faces of the dielectric substrate 10. The ground line of the coaxial cable 81 is electrically connected to the conductor plane 11. The signal line of the coaxial cable 81 penetrates the dielectric substrate 10 and is electrically connected to the antenna element 82.

In the antenna 8 having such a configuration, the structure 1 according to the present invention functions as an EBG structure, that is, a magnetic wall. Consequently, a reflector which reflects electromagnetic wave in phase, emitted from the antenna element 82 is constructed by the structure 1. Since the reflector reflects the electromagnetic wave in phase, the antenna element 82 can be disposed close to the reflector. As a result, the antenna 8 which is much thinner than the conventional one can be realized. Since the reflector is constructed by the structure according to the invention, the low-cost and high-reliability antenna 8 can be obtained.

Although the antenna using the structure according to the invention has been described in the fifth and sixth embodiments, by employing at least one of a transmitter and a receiver which are connected to the antenna according to the invention, an electronic device according to the present invention such as a communication device can be also constructed.

Seventh Embodiment

Figure 39A:
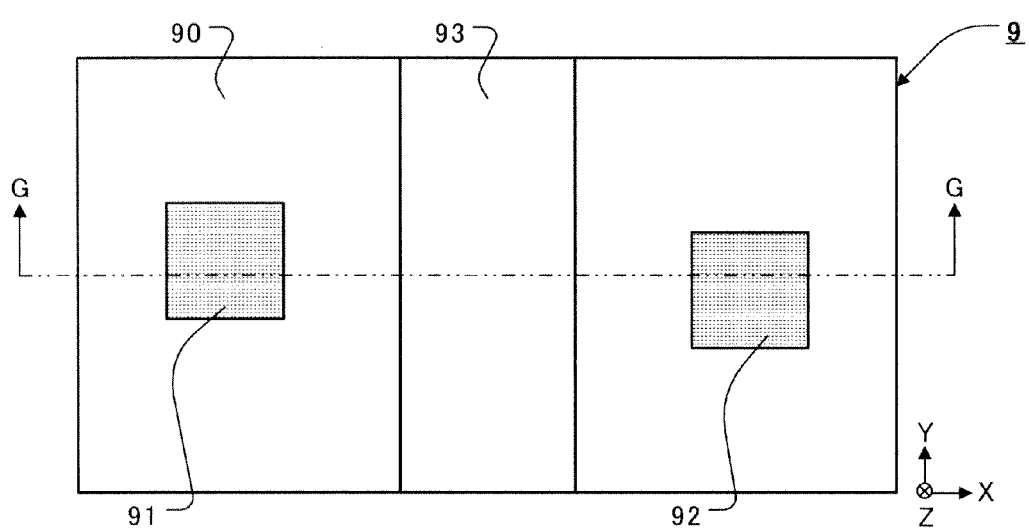
FIGS. 39A and 39B are plan view and cross section, respectively, of a printed circuit board of a seventh embodiment.
Figure 39B:
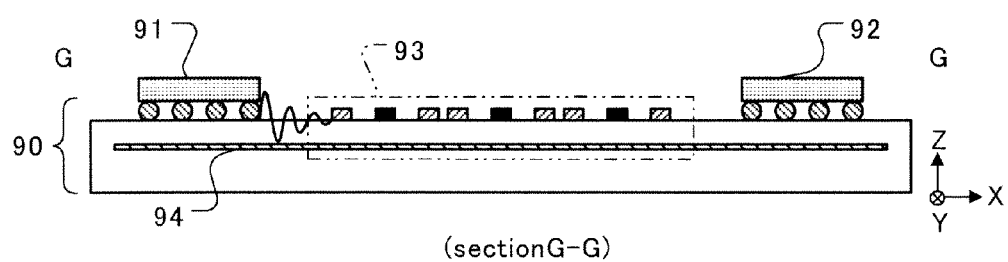

A printed circuit board according to a seventh embodiment will now be described. As shown in FIGS. 39A and 39B, a printed circuit board 9 has a substrate 90, devices 91 and 92, and a structure 93 disposed between the devices 91 and 92. The substrate 90 includes a ground pattern 94 and a dielectric layer provided on the ground pattern 94. The ground pattern 94 is electrically connected to a first conductor element (in this embodiment, a conductor plane) of the structure 93. The plane of the devices 91 and 92 is provided on the surface layer of the dielectric layer and is electrically connected to the ground pattern 94. The device 91 is a device as a noise source, and the device 92 is a device which is easily influenced by noise.

When noise which occurs in the device 91 propagates via the substrate 90 to the device 92, it becomes a factor causing erroneous operation or the like in the device 92. Consequently, in the printed circuit board 9, the structure 93 is disposed to interrupt a part which can become a noise propagation path between the devices 91 and 92.

The structure 93 is disposed in a band shape continuously from one end to the other end of the printed circuit board 9 in a direction crossing a direction from the device 91 to the device 92. The structure 93 is the structure of the present invention, and a band gap is included in the dispersion relation. The band gap is set in a frequency band including the frequency band of noise which occurs in the device 91.

In the printed circuit board 9 having such a configuration, noise occurring in the device 91 is interrupted by the structure 93. Therefore, in the printed circuit board 9, propagation of noise to the device 92 is dramatically reduced, and erroneous operation of the device 92 can be suppressed. The structure 93 is the structure to which the present invention is applied, so that the printed circuit board 9 can be made a low-cost high-reliable printed circuit board. In the printed circuit board 9, the band gap in the structure 93 can be easily controlled, so that noise in a wider frequency band can be handled.

In the seventh embodiment, the configuration having the band-shaped structure 93 has been described. However, it is sufficient to dispose the structure 93 so as to interrupt the noise propagation path. The plane shape and disposition of the structure 93 can be properly modified. For example, the structure may be provided so as to surround the device 92 which is susceptible to influence of noise.

In the seventh embodiment, the configuration in which the structure according to the present invention is mounted on the printed circuit board has been described. Also in the case of mounting the structure according to the present invention on an electronic part other than the printed circuit board, the effects of the present invention can be obtained. For example, it is naturally possible to provide the structure according to the invention to a package substrate of a device or the like and provide the structure according to the invention to a semiconductor device such as a silicon device by using the micro wiring process.

Although suppression of noise propagation between the devices has been described as an example, for example, also in the case of suppressing unnecessary coupling of antennas mounted close to each other, the structure according to the present invention can be used in a manner similar to the case of the device.

Eighth Embodiment

Figure 40A:
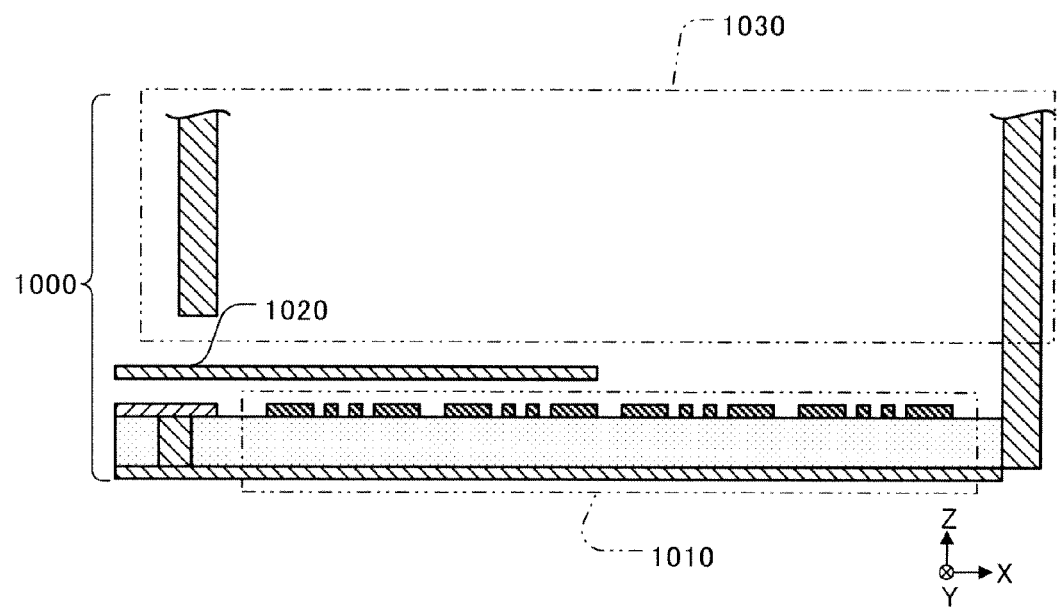
FIGS. 40A and 40B are cross section and plan view, respectively, of a transmission line waveguide converter of an eighth embodiment.
Figure 40B:
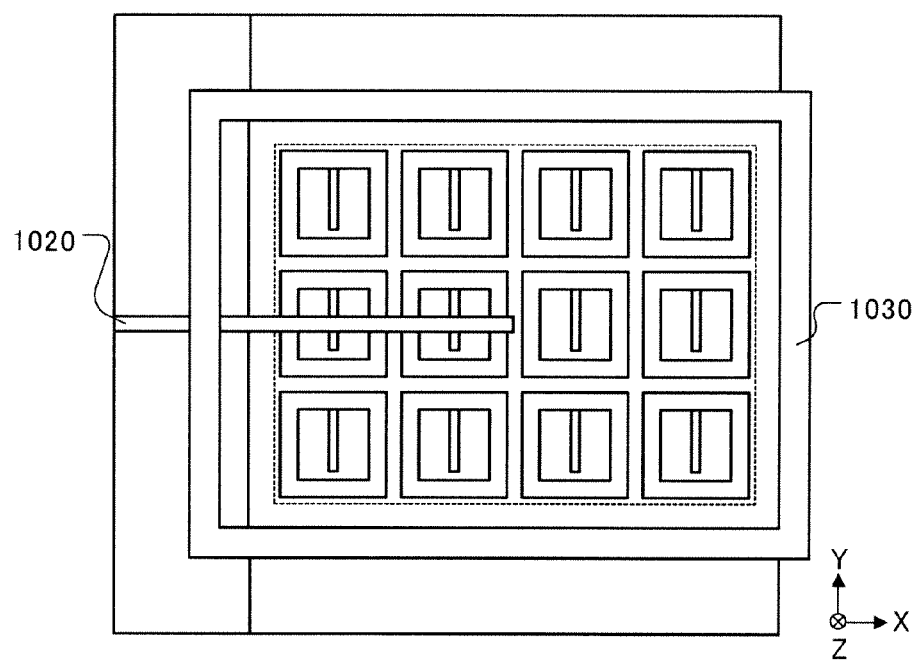

A transmission line waveguide converter according to an eighth embodiment of the invention will now be described. As shown in FIGS. 40A and 40B, a transmission line waveguide converter 1000 has a structure 1010 as a reflector, a transmission line 1020, and a waveguide 1030. A band gap in the structure 1010 is designed so as to correspond to the frequency band of electromagnetic wave transmitted.

In the transmission line waveguide converter 1000 having such a configuration, the electromagnetic wave is reflected in phase in the structure 1010, so that the transmission line 1020 can be disposed close to the surface of the structure 1010. In such a manner, the thin-type transmission line waveguide converter 1000 can be realized. Since the structure 1010 is a structure to which the present invention is applied, the low-cost high-reliability transmission line waveguide converter 1000 can be realized.

Ninth Embodiment

Figure 41:
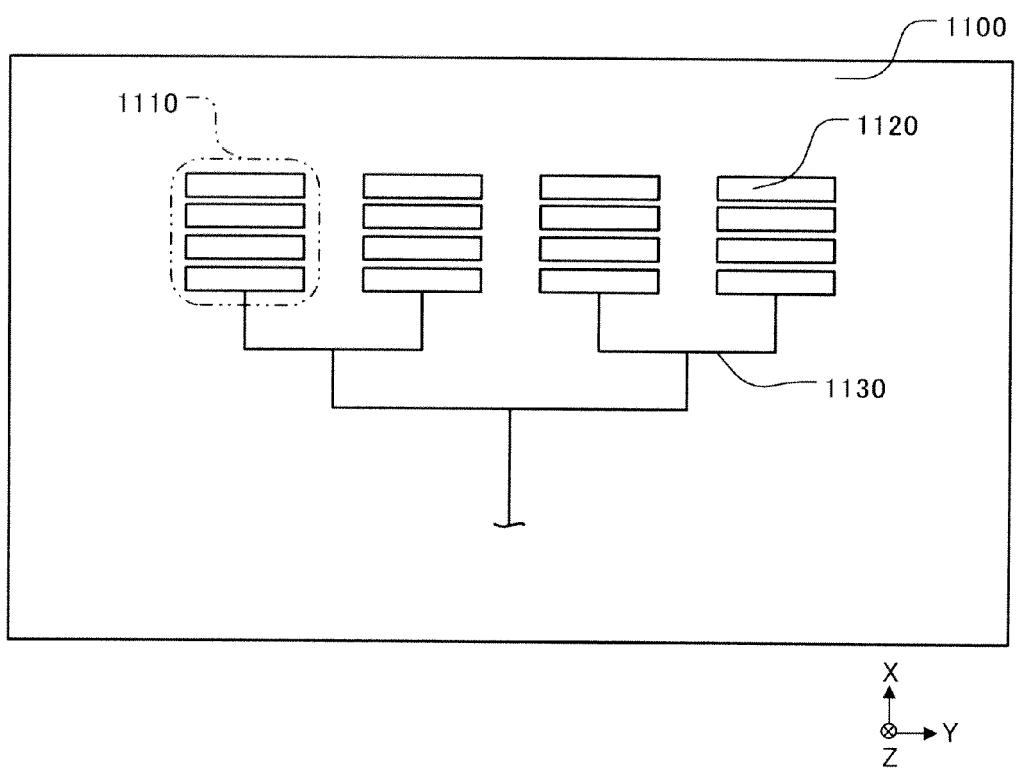
FIG. 41 is a conceptual diagram of an array antenna of a ninth embodiment.

An array antenna according to a ninth embodiment of the present invention will now be described. As shown in FIG. 41, the array antenna of the ninth embodiment has a configuration that the antenna according to the present invention is used as an array element 1110 and a plurality of array elements 1110 are arranged on a printed circuit board 1100. The array element 1110 has a structure 1120 according to the present invention. The antenna described in the fifth embodiment is employed as the array element 1100, and four array elements 1110 are arranged one-dimensionally. The array elements 1110 are connected in parallel by a microstrip line 1130.

In the array antenna of the ninth embodiment, the directivity becomes a beam shape, and the antenna gain in the beam direction can be increased. As the array element 1110, the antenna of another embodiment of the present invention can be also naturally used. By increasing the number of array elements 1110, a beam can be further sharpened, and the gain in the beam direction can be increased.

The present application is based on Japanese Patent Application 2009-276533 filed on Dec. 4, 2009. The entire contents of the specification, the claims, and the drawings of Japanese Patent Application 2009-276533 are incorporated herein by reference.

DESCRIPTION OF REFERENCE NUMERALS 1, 1B to 1I, 2, 2B to 2D, 3, 3B to 3E, 4, 55, 65, 75, 75B, 93, 1120 structures
5 to 7, 7B, 7C, 8 antennas
9 printed circuit board
10, 20, 30, 40, 50, 60 dielectric substrates (first media)
11, 31, 51, 61, 71 conductor planes (first conductor elements)
12, 12b, 12c, 32, 32b, 52, 62, 72 conductor patches (second conductor elements)
13, 13b, 13c, 23, 33, 43, 53, 63, 73 openings
14, 14b to 14j, 24, 24b to 24g, 24i, 34, 44, 54, 64, 74 wires (line parts)
15, 15b, 25 unit cells
16, 26 microstrip lines
19, 35, 59 conductor patterns
21, 41 conductor planes (second conductor elements)
22, 42 conductor patches (first conductor elements)
37, 47 dielectric layers (second media)
38, 38b to 38d, 48 auxiliary conductor patches (third conductor element(s))
39 capacitance part
56, 66, 76 power feeders
77, 81 coaxial cables (power feeders)
82 antenna element
90 substrate
91, 92 devices
94 ground pattern
141 open end
142, 145, 147, 241, 245, 246 connection parts
143, 144, 243, 244 branch wires
146, 242 branch parts
1100 printed circuit board
1110 array element
Pa pitch (lattice constant)
C1, C2, C3, CL, CR capacitance
f frequency
$f_0C$, $f_0M$ half-wavelength resonance frequency
$f_{se}$ resonance frequency
LR inductance
Y admittance
Z impedance
β wave number
λ wavelength

The invention claimed is:

1. A structure comprising:
at least one first conductor element;
a conductor pattern with at least one second conductor element facing the first conductor element; and
a first medium generating capacitance between the first conductor element and the second conductor element, wherein
the first conductor element and the conductor pattern face each other via the first medium,
the second conductor element includes a line part which has an open end and is connected only to the second conductor element and includes an opening partially surrounding the line part,
the line part is continuous to the second conductor element,
the opening is surrounded by the second conductor element,
the first conductor element and the line part make up a microstrip line, and
a conductive member for making the first conductor element and the second conductor element conductive is not provided.

2. The structure according to claim 1, wherein
the conductor pattern comprises the plurality of second conductor elements disposed periodically,
each of the first conductor elements is disposed continuous to neighboring first conductor element, and
each of the second conductor elements is disposed apart from neighboring second conductor element and includes the opening and the line part in correspondence with the first conductor element.

3. The structure according to claim 2, further comprising
at least one third conductor element and a second medium generating capacitance between the second and third conductor elements, wherein
the third conductor element faces at least two second conductor elements via the second medium.

4. The structure according to claim 2, wherein
unit cells each comprising the line part, the opening, the second conductor element, and the first conductor element of a part facing the line part or the second conductor element are one-dimensionally arranged.

5. The structure according to claim 2, wherein
unit cells each comprising the line part, the opening, the second conductor element, and the first conductor element of a part facing the line part or the second conductor element are two-dimensionally arranged.

6. The structure according to claim 2, wherein
a plurality of line parts have substantially the same length.

7. The structure according to claim 2, wherein
connection parts in each of which the line part is connected to the second conductor element are disposed periodically in the conductor pattern.

8. The structure according to claim 2, wherein
the plurality of line parts have substantially the same shape and dimension, and shapes and dimensions of the openings are almost the same in the conductor pattern.

9. The structure according to claim 1, wherein
the conductor pattern comprises the plurality of second conductor elements disposed periodically,
each of the first conductor elements is disposed apart from neighboring first conductor element, and
each of the second conductor elements is continuous to neighboring second conductor element and includes the opening and the line part in correspondence with the first conductor element.

10. The structure according to claim 9, further comprising at least one third conductor element and a second medium generating capacitance between the first and third conductor elements, wherein
the third conductor element faces at least two first conductor elements via the second medium.

11. The structure according to claim 9, wherein
unit cells each comprising the line part, the opening, the second conductor element, and the first conductor element of a part facing the line part or the second conductor element are one-dimensionally arranged.

12. The structure according to claim 9, wherein
unit cells each comprising the line part, the opening, the second conductor element, and the first conductor element of a part facing the line part or the second conductor element are two-dimensionally arranged.

13. The structure according to claim 9, wherein
a plurality of line parts have substantially the same length.

14. The structure according to claim 9, wherein
connection parts in each of which the line part is connected to the second conductor element are disposed periodically in the conductor pattern.

15. The structure according to claim 9, wherein
the plurality of line parts have substantially the same shape and dimension, and shapes and dimensions of the openings are almost the same in the conductor pattern.

16. The structure according to claim 1, wherein
the line part is made of the same material as that of the second conductor element and is integrated with the second conductor element.

17. The structure according to claim 1, wherein the line part has a band shape whose width is substantially uniform.

18. An antenna comprising:
a structure; and
a power feeder, wherein
the structure comprises:
    at least one first conductor element;
    a conductor pattern with at least one second conductor element facing the first conductor element; and
    a first medium generating capacitance between the first conductor element and the second conductor element,
the first conductor element and the conductor pattern face each other via the first medium,
the second conductor element includes a line part which has an open end and is connected only to the second conductor element and includes an opening partially surrounding the line part,
the line part is continuous to the second conductor element,
the opening is surrounded by the second conductor element,
the power feeder is electrically connected to the first conductor element or the conductor pattern of the structure, and
a conductive member for making the first conductor element and the second conductor element conductive is not provided.

19. A printed circuit board comprising a structure, wherein
the structure comprises:
    at least one first conductor element;
    a conductor pattern with at least one second conductor element facing the first conductor element; and
    a first medium generating capacitance between the first conductor element and the second conductor element,
the first conductor element and the conductor pattern face each other via the first medium,
the second conductor element includes a line part which has an open end and is connected only to the second conductor element and includes an opening partially surrounding the line part,
the line part is continuous to the second conductor element,
the opening is surrounded by the second conductor element,
the first conductor element and the line part make up a microstrip line, and
a conductive member for making the first conductor element and the second conductor element conductive is not provided.

20. A transmission line waveguide converter comprising a structure, wherein
the structure comprises:
    at least one first conductor element;
    a conductor pattern with at least one second conductor element facing the first conductor element; and
    a first medium generating capacitance between the first conductor element and the second conductor element,
the first conductor element and the conductor pattern face each other via the first medium,
the second conductor element includes a line part which has an open end and is connected only to the second conductor element and includes an opening partially surrounding the line part,
the line part is continuous to the second conductor element,
the opening is surrounded by the second conductor element,
the first conductor element and the line part make up a microstrip line, and
a conductive member for making the first conductor element and the second conductor element conductive is not provided.

* * * * *